(12) United States Patent
Breen et al.

(10) Patent No.: US 9,701,899 B2
(45) Date of Patent: Jul. 11, 2017

(54) COMPOSITIONS, OPTICAL COMPONENT, SYSTEM INCLUDING AN OPTICAL COMPONENT, DEVICES, AND OTHER PRODUCTS

(71) Applicant: SAMSUNG ELECTRONICS CO., LTD, Suwon-si (KR)

(72) Inventors: Craig Breen, Somerville, MA (US); John R. Linton, Concord, MA (US); Jonathan S. Steckel, Cupertino, CA (US); Marshall Cox, Brooklyn, NY (US); Seth Coe-Sullivan, Redondo Beach, CA (US); Mark Comerford, Boston, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 86 days.

(21) Appl. No.: 14/500,200

(22) Filed: Sep. 29, 2014

(65) Prior Publication Data
US 2015/0086169 A1    Mar. 26, 2015

Related U.S. Application Data

(63) Continuation of application No. 12/655,069, filed on Dec. 22, 2009, now Pat. No. 8,849,087, which is a
(Continued)

(51) Int. Cl.
*G02B 6/00* (2006.01)
*C09K 11/02* (2006.01)
(Continued)

(52) U.S. Cl.
CPC .............. *C09K 11/025* (2013.01); *C30B 7/14* (2013.01); *C30B 29/40* (2013.01); *C30B 29/48* (2013.01);
(Continued)

(58) Field of Classification Search
CPC ........ G02B 2006/12035; G02B 6/0016; G02B 6/004; G02B 6/0229
(Continued)

(56) References Cited

U.S. PATENT DOCUMENTS 6,576,291 B2    6/2003    Bawendi et al.
6,819,692 B2    11/2004   Klimov et al.
(Continued)

FOREIGN PATENT DOCUMENTS

JP    2004-071357 A    3/2004
JP    2004-107572 A    4/2004
(Continued)

OTHER PUBLICATIONS

Final Office Action—U.S. Appl. No. 14/270,098 dated Dec. 8, 2016, citing references listed within.
(Continued)

*Primary Examiner* — Charlie Y Peng
(74) *Attorney, Agent, or Firm* — Cantor Colburn LLP

(57) ABSTRACT

The present inventions relate to optical components which include quantum confined semiconductor nanoparticles, wherein at least a portion of the nanoparticles include a ligand attached to a surface thereof, the ligand being represented by the formula: X-Sp-Z, wherein: X represents a primary amine group, a secondary amine group, a urea, a thiourea, an imidizole group, an amide group, an other nitrogen containing group, a carboxylic acid group, a phosphonic or arsonic acid group, a phosphinic or arsinic acid group, a phosphate or arsenate group, a phosphine or arsine oxide group; Sp represents a spacer group, such as a group capable of allowing a transfer of charge or an insulating group; and Z represents: (i) a reactive group capable of communicating specific chemical properties to the nanocrystal as well as provide specific chemical reactivity to the
(Continued)

surface of the nanocrystal, and/or (ii) a group that is cyclic, halogenated, or polar a-protic. Compositions, systems, kits, films, inks, and TFEL lamps are also disclosed.

14 Claims, 3 Drawing Sheets

Related U.S. Application Data continuation-in-part of application No. PCT/US2008/010651, filed on Sep. 12, 2008, which is a continuation-in-part of application No. PCT/US2007/024750, filed on Dec. 3, 2007, and a continuation-in-part of application No. PCT/US2008/007902, filed on Jun. 25, 2008, and a continuation-in-part of application No. PCT/US2007/013152, filed on Jun. 4, 2007, said application No. 12/655,069 is a continuation-in-part of application No. 12/283,609, filed on Sep. 12, 2008, now Pat. No. 8,718,437, which is a continuation-in-part of application No. PCT/US2008/007902, said application No. 12/283,609 is a continuation-in-part of application No. 12/231,887, filed on Sep. 5, 2008, now Pat. No. 8,642,977, which is a continuation of application No. PCT/US2007/005589, filed on Mar. 6, 2007.

(60) Provisional application No. 61/140,051, filed on Dec. 22, 2008, provisional application No. 60/971,887, filed on Sep. 12, 2007, provisional application No. 60/992,598, filed on Dec. 5, 2007, provisional application No. 61/083,998, filed on Jul. 28, 2008, provisional application No. 60/971,885, filed on Sep. 12, 2007, provisional application No. 60/973,644, filed on Sep. 19, 2007, provisional application No. 61/016,227, filed on Dec. 21, 2007, provisional application No. 60/810,767, filed on Jun. 2, 2006, provisional application No. 60/810,914, filed on Jun. 5, 2006, provisional application No. 60/804,921, filed on Jun. 15, 2006, provisional application No. 60/825,373, filed on Sep. 12, 2006, provisional application No. 60/825,374, filed on Sep. 12, 2006, provisional application No. 60/825,370, filed on Sep. 12, 2006, provisional application No. 60/886,261, filed on Jan. 23, 2007, provisional application No. 60/946,090, filed on Jun. 25, 2007, provisional application No. 60/949,306, filed on Jul. 12, 2007, provisional application No. 60/946,382, filed on Jun. 26, 2007, provisional application No. 60/971,885, filed on Sep. 12, 2007, provisional application No. 60/973,644, filed on Sep. 19, 2007, provisional application No. 61/016,227, filed on Dec. 21, 2007, provisional application No. 60/950,598, filed on Jul. 18, 2007, provisional application No. 60/779,740, filed on Mar. 7, 2006.

(51) Int. Cl.
  *G02B 6/10* (2006.01)
  *C30B 29/48* (2006.01)
  *C30B 7/14* (2006.01)
  *C30B 29/40* (2006.01)
  *C30B 29/60* (2006.01)
  *B82Y 20/00* (2011.01)

(52) U.S. Cl.
  CPC ............... *C30B 29/60* (2013.01); *G02B 6/10* (2013.01); *B82Y 20/00* (2013.01); *Y10S 977/774* (2013.01); *Y10S 977/786* (2013.01); *Y10S 977/95* (2013.01); *Y10T 428/24893* (2015.01)

(58) Field of Classification Search
  USPC .................................................. 385/129–132
  See application file for complete search history.

(56) References Cited

U.S. PATENT DOCUMENTS

| | | |
|---|---|---|
| 6,890,078 B2 | 5/2005 | Koide |
| 7,166,010 B2 | 1/2007 | Lamansky et al. |
| 7,560,747 B2 | 7/2009 | Cok |
| 8,330,348 B2 | 12/2012 | Berben et al. |
| 8,849,087 B2 * | 9/2014 | Breen ................. B82Y 20/00 385/141 |
| 2004/0004433 A1 | 1/2004 | Lamansky et al. |
| 2004/0023010 A1 | 2/2004 | Bulovic et al. |
| 2004/0091710 A1 * | 5/2004 | Bawendi ............. B82Y 30/00 428/407 |
| 2006/0255711 A1 | 11/2006 | Dejima et al. |
| 2007/0079927 A1 | 4/2007 | Lamansky et al. |
| 2007/0154735 A1 | 7/2007 | Nakayama |
| 2007/0159837 A1 * | 7/2007 | Flehinghaus ........ G02B 6/0041 362/459 |
| 2008/0173886 A1 * | 7/2008 | Cheon ................... C09K 11/02 257/98 |
| 2010/0328923 A1 * | 12/2010 | Shaikevitch ............. C09J 7/02 362/84 |
| 2013/0164875 A1 | 6/2013 | Lamansky et al. |

FOREIGN PATENT DOCUMENTS

| | | |
|---|---|---|
| JP | 2004133111 A | 4/2004 |
| JP | 2005-531915 A | 10/2005 |
| JP | 2006-073202 A | 3/2006 |
| JP | 2007-103513 A | 4/2007 |
| JP | 2009-514178 A | 4/2009 |
| WO | 2006-022123 A1 | 3/2006 |
| WO | 2006-120895 A1 | 11/2006 |
| WO | 2007-051499 A1 | 5/2007 |

OTHER PUBLICATIONS

Korean Notice of Allowance dated Mar. 29, 2017 issued for the corresponding Korean Patent Application No. 10-2010-7001056 with English Translation.
Notice of Allowance, issued on May 1, 2017 for U.S. Appl. No. 14/732,772.
Office Action dated Mar. 29, 2017, issued for Japanese Patent Application No. 2016-041098, with English Translation.

\* cited by examiner

COMPOSITIONS, OPTICAL COMPONENT, SYSTEM INCLUDING AN OPTICAL COMPONENT, DEVICES, AND OTHER PRODUCTS

This application is a continuation of U.S. patent application Ser. No. 12/655,069 filed 22 Dec. 2009, which claims priority to U.S. Application No. 61/140,051 filed 22 Dec. 2008. The disclosures of each of the foregoing are hereby incorporated herein by reference in their entireties.

U.S. patent application Ser. No. 12/655,069 is also a continuation-in-part of International Application No. PCT/US2008/010651, filed 12 Sep. 2008, which claims priority from U.S. Application Nos. 60/971,887, filed 12 Sep. 2007; 60/992,598, filed 5 Dec. 2007; 61/083,998, filed 28 Jul. 2008; 60/971,885, filed 12 Sep. 2007; 60/973,644, filed 19 Sep. 2007; 61/016,227, filed 21 Dec. 2007; PCT/US2007/024750, filed 3 Dec. 2007; and PCT/US2008/007902, filed 25 Jun. 2008. International Application No. PCT/US2008/010651 is also a continuation-in-part of International Application No. PCT/US2007/013152, filed 4 Jun. 2007. PCT Application No. PCT/US2007/013152 claims priority from U.S. Application Nos. 60/810,767 filed 2 Jun. 2006, 60/810,914 filed 5 Jun. 2006, 60/804,921 filed 15 Jun. 2006, 60/825,373 filed 12 Sep. 2006, 60/825,374 filed 12 Sep. 2006, 60/825,370 filed 12 Sep. 2006, and 60/886,261, filed 23 Jan. 2007.

U.S. patent application Ser. No. 12/655,069 is also a continuation-in-part of U.S. application Ser. No. 12/283,609, filed 12 Sep. 2008, now U.S. Pat. No. 8,718,437 issued 6 May 2014, which is a continuation-in-part of International Application No. PCT/US2008/007902, filed 25 Jun. 2008, which claims priority from U.S. Application Nos. 60/946,090, filed 25 Jun. 2007; 60/949,306, filed 12 Jul. 2007; 60/946,382, filed 26 Jun. 2007; 60/971,885, filed 12 Sep. 2007; 60/973,644, filed 19 Sep. 2007; 61/016,227, filed 21 Dec. 2007; and 60/950,598 filed 18 Jul. 2007. U.S. application Ser. No. 12/283,609 is also a continuation-in-part of U.S. application Ser. No. 12/231,887, filed 5 Sep. 2008, now U.S. Pat. No. 8,642,977 issued 4 Feb. 2014, which is a continuation of International Application No. PCT/US2007/005589 filed 6 Mar. 2007. International Application No. PCT/US2007/005589 claims priority from U.S. Application No. 60/779,740 filed 7 Mar. 2006.

The disclosures of each of the foregoing applications are hereby incorporated herein by reference in their entireties.

TECHNICAL FIELD OF THE INVENTION

The present invention relates to the technical fields of optical components, systems including optical components, devices including optical components, and compositions useful in the foregoing.

SUMMARY OF THE INVENTION

As used herein, the term "optical components" includes, but is not limited to, optical components, systems including optical components, lamps including optical components, devices including optical components, films useful in the foregoing, inks useful in making the foregoing, and compositions useful in the foregoing.

The present inventions relate to optical components which include quantum confined semiconductor nanoparticles, wherein at least a portion of the nanoparticles include a ligand attached to a surface thereof, the ligand being represented by the formula:

X-Sp-Z wherein:

X represents a primary amine group, a secondary amine group, a urea, a thiourea, an imidizole group, an amide group, an other nitrogen containing group, a carboxylic acid group, a phosphonic or arsonic acid group, a phosphinic or arsinic acid group, a phosphate or arsenate group, a phosphine or arsine oxide group;

Sp represents a spacer group, such as a group capable of allowing a transfer of charge or an insulating group; and Z represents: (i) a reactive group capable: of communicating specific chemical properties to the nanocrystal as well as provide specific chemical reactivity to the surface of the nanocrystal, and/or (ii) a group that is cyclic, halogenated, or polar a-protic.

In certain embodiments, Z in all cases is not reactive upon exposure to light.

In certain preferred embodiments, the ligand attaches or coordinates to a surface of the nanoparticle during formation or overcoating thereof.

In certain preferred embodiments, such ligand comprises a native ligand.

Examples of Sp include, but are not limited to, straight or branched $C_1$-$C_{18}$ hydrocarbon chains. In certain embodiments, the hydrocarbon chain includes at least one double bond, at least one triple bond, or at least one double bond and one triple bond. In certain embodiments, the hydrocarbon chain is interrupted by —O—, —S—, —N($R_a$)—, —N($R_a$)—C(O)—O—, —O—C(O)—N($R_a$)—, —N($R_a$)—C(O)—N($R_b$)—, —O—C(O)—O—, —P($R_a$)—, or —P(O)($R_a$)—, wherein each of $R_a$ and $R_b$, independently, is hydrogen, alkyl, alkenyl, alkynyl, alkoxy, hydroxylalkyl, hydroxyl, or haloalkyl.

Examples of reactive groups include; without limitation, functional, bifunctional, and polyfunctional reagents (e.g., homobifunctional or heterobifunctional), and reactive chemical groups (e.g., thiol, or carboxyl, hydroxyl, amino, amine, sulfo, and the like). Examples of additional reactive groups include carbodithioate, carbodithioic acid, thiourea, amide, carboxylic acid, phosphine oxide, phosphonic or phosphinic acid, thiophosphonic or thiophosphinic acid, which can be substituted with alkyl and/or aryl units that are perhalogenated or partially halogenated. Examples of cyclic groups include, but are not limited to, saturated or unsaturated cyclic or bicyclic compounds (e.g. cyclohexyl, isobornyl, etc.), or aromatic compounds (e.g. phenyl, benzyl, naphthyl, biphenyl, fluorenyl, triarylamine, etc.). In certain embodiments, a cyclic group can include one or more substituent groups (including, for example, but not limited to, a reactive chemical group, an organic group (alky, aryl, etc.), etc.). Halogenated groups include, but are not limited to, fluorinated groups, perfluorinated groups, (e.g. perfluoroalkyl, perfluorophenyl, perfluoroamines, etc.), chlorinated groups, perchlorinated groups. Examples of polar a-protic groups include, but are not limited to, ketones, aldehydes, amides, ureas, urethanes, imines, etc.

In certain embodiments, the group comprising Z imparts predetermined chemical miscibility properties to the semiconductor nanocrystal to which it is attached.

In certain embodiments, Z does not include a non-functionalized straight or branched $C_1$-$C_{18}$ hydrocarbon chain.

In certain embodiments, Z does not render the nanoparticle dispersible in a liquid medium that includes water.

In certain preferred embodiments, the nanoparticle comprises a semiconductor nanocrystal.

In certain embodiments, at least a portion of the nanoparticles can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein a first ligand is represented by the formula:

N-Sp-Z wherein:

N represents a primary amine group, a secondary amine group, a urea, a thiourea, an imidizole group, an amide group, or other nitrogen containing functional group; and a second ligand is represented by the formula:

Y-Sp-Z wherein:

Y represents a carboxylic acid group, a phosphonic or arsonic acid group, a phosphinic or arsinic acid group, a phosphate or arsenate group, a phosphine or arsine oxide group, or other phosphorous-containing or arsenic-containing functional group.

Examples of Sp and Z for inclusion in N-Sp-Z and Y-Sp-Z include, without limitation, those described herein. Sp and Z can be independently selected. Sp and Z included in each of the two ligands can be the same or different.

In certain embodiments, one or both of such ligands comprise a native ligand.

In certain embodiments of the present inventions contemplated by this disclosure, preferred ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, and a mixture of the foregoing. In certain embodiments, a ligand comprises 3,5-di-tert-butyl-4-hydroxybenzylphosphonic acid, a conjugate base of the acid, or a mixture of the foregoing. Other preferred ligands include ligands comprising an organic amine including a terminal hydroxyl group or a fluorinated organic amine.

In accordance with one aspect of the present invention, there is provided an optical component including a waveguide component comprising from about 0.001 to about 15 weight percent quantum confined semiconductor nanoparticles based on the weight of the waveguide component, wherein at least a portion of the nanoparticles include a one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprises a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the waveguide component is transparent to the light coupled to the waveguide component from a light source and to light emitted by the nanoparticles. In certain embodiments, the optical component further includes a filter layer disposed over and/or under the nanoparticles. In certain embodiments, the waveguide component further includes scatterers in an amount in the range from about 0.001 to about 15 weight percent of the weight of the waveguide component. In certain embodiments, the nanoparticles comprise a core/shell structure. In certain embodiments, the waveguide component is adapted for having a light source optically coupled thereto. In certain embodiments, the nanoparticles are included in a layer disposed over a predetermined region of a surface of the waveguide component. In certain embodiments, the layer comprising nanoparticles has a thickness from about 0.1 to about 200 microns. In certain embodiments, the layer comprising nanoparticles is sufficiently thick so as to absorb light incident thereon. In certain embodiments, the layer further comprises a host material in which the quantum confined semiconductor nanoparticles are distributed. In certain embodiments, the quantum confined semiconductor nanoparticles are included in a composition further including a host material, wherein the composition includes from about 0.001 to about 15 weight percent quantum confined semiconductor nanoparticles based on the weight of the host material. Preferably the host material comprises a solid (as opposed to a liquid) material. In certain embodiments, the nanoparticles are included in a predetermined arrangement disposed over a predetermined region of a surface of the waveguide component. In certain embodiments, the composition is included in a predetermined arrangement disposed over a predetermined region of a surface of the waveguide component. In certain embodiments, the nanoparticles are embedded in a predetermined region of the waveguide component in a predetermined arrangement. In certain embodiments, the predetermined arrangement has a thickness from about 0.1 to about 200 microns.

In accordance with another aspect of the invention, there is provided an optical component including a waveguide component including a composition comprising quantum confined semiconductor nanoparticles and a host material, wherein the composition includes from about 0.001 to about 15 weight percent quantum confined semiconductor nanoparticles based on the weight of the host material, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the composition further comprises scatterers. In certain embodiments, the scatterers are included in the composition in an amount in the range from about 0.001 to about 15 weight percent of the weight of the host material. Preferably the host material comprises a solid (as opposed to a liquid) material. In certain embodiments, the composition is disposed in a predetermined arrangement over a predetermined region of a surface of the waveguide component. In certain embodiments, the predetermined arrangement has a thickness from about 0.1 to about 200 microns. In certain embodiments, the composition is embedded in a predetermined region of the waveguide component in a predetermined arrangement. In certain embodiments, the optical component further includes means for coupling light from a light source into the waveguide component.

In accordance with another aspect of the present invention, there is provided an optical component including a waveguide component including a layer comprising quantum confined semiconductor nanoparticles and a host material, wherein the layer includes from about 0.001 to about 15 weight percent quantum confined semiconductor nanoparticles based on the weight of the host material, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand. In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

Preferably the host material comprises a solid (as opposed to a liquid) material. In certain embodiments, the layer further comprises scatterers. In certain embodiments, the scatterers are included in the layer in an amount in the range from about 0.001 to about 15 weight percent of the weight of the host material. In certain embodiments, the optical component further includes means for coupling light from a light source into the waveguide component.

In accordance with another aspect of the invention, there is provided an optical component comprising a film including a carrier substrate including quantum confined semiconductor nanoparticles in a predetermined arrangement over a predetermined region of a surface thereof, wherein the film is attached to a surface of a waveguide component and wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand. In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the optical component further includes means for coupling light from a light source into a waveguide component. In certain embodiments, the film includes from about 0.001 to about 15 weight percent quantum confined semiconductor nanoparticles based on the weight of the film. In certain embodiments, the film comprises a film taught herein. In certain embodiments, the film comprises a decal.

In accordance with another aspect of the present invention, there is provided an optical component comprising a film including a carrier substrate including a composition comprising quantum confined semiconductor nanoparticles and a host material, wherein the composition is disposed in a predetermined arrangement over a predetermined region of a surface thereof, wherein the film is attached to a surface of a waveguide component and wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the composition includes from about 0.001 to about 15 weight percent quantum confined semiconductor nanoparticles based on the weight of the host material. Preferably the host material comprises a solid (as opposed to a liquid) material. In certain embodiments, the composition further comprises scatterers. In certain embodiments, scatterers are included in the composition in an amount in the range from about 0.001 to about 15 weight percent of the weight of the host material. In certain embodiments, the film comprises a decal.

In accordance with another aspect of the present invention, there is provided a system comprising an optical component including a waveguide component comprising from about 0.001 to about 15 weight percent quantum confined semiconductor nanoparticles based on the weight of the waveguide component and a light source optically coupled to the waveguide component, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the light source is optically coupled to an edge of the waveguide component. In certain embodiments, the light source is optically coupled to a surface of the waveguide component. In certain embodiments, the nanoparticles are included in a predetermined arrangement disposed over a surface of the waveguide component. In certain embodiments, the nanoparticles are included in a layer disposed over a surface of the waveguide components. In certain embodiments, the quantum confined semiconductor nanoparticles included in a layer are arranged in one or more predetermined arrangements. In certain embodiments, the layer further comprises a host material in which the quantum confined semiconductor nanoparticles are distributed. In certain embodiments, the layer further comprises scatterers. In certain embodiments, the nanoparticles are included in the layer in an amount in the range from about 0.001 to about 15 weight percent of the weight of the host material. Preferably the host material comprises a solid (as opposed to a liquid) material.

In accordance with another aspect of the present invention, there is provided a system comprising an optical component including a film in taught herein disposed over a waveguide component and a light source optically coupled to the waveguide component. In certain embodiments, the film comprises a decal.

In accordance with another aspect of the present invention, there is provided a system comprising an optical component including a waveguide component including a composition comprising quantum confined semiconductor nanoparticles and a host material, wherein the layer includes from about 0.001 to about 15 weight percent quantum confined semiconductor nanoparticles based on the weight of the host material and a light source optically coupled to the waveguide component and wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

Preferably the host material comprises a solid (as opposed to a liquid) material. In certain embodiments, the composition further comprises scatterers.

In certain embodiments, a system can include two or more optical components taught herein and one or more lights sources. In certain of such embodiments, the optical components are preferably arranged such that the waveguide component of each is parallel to that of each other optical component, and each optical component is coupled to a separate light source. In certain of such embodiments, the optical components are preferably optically separated from each such that there is no "optical communication" or "cross-talk" between the optical components. In certain of such embodiments, such separation can be achieved by an air gap due to physical spacing between the components or by a layer of low index of refraction material. Other suitable techniques of optical separation can also be used. In certain embodiments, each optical component is coupled to a separate light source.

In accordance with another aspect of the present invention, there is provided a device including an optical component taught herein.

In accordance with another aspect of the present invention, there is provided a device including a film taught herein.

In accordance with another aspect of the present invention, there is provided a device including a system taught herein.

In certain embodiments, a device comprises a display. In certain embodiments, a device comprises a solid state lighting device or other lighting unit. In certain embodiments, a device comprises a sign. In certain embodiments, a device comprises a photovoltaic device. In certain embodiments, a device comprises another electronic or optoelectronic device.

In accordance with another aspect of the present invention, there is provided a composition useful for altering the wavelength of visible or invisible light, the composition comprising a host material and quantum confined semiconductor nanoparticles, wherein the nanoparticles are included in the composition in amount in the range from about 0.001 to about 15 weight percent based on the weight of the host material and wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

Preferably the host material comprises a solid (as opposed to a liquid) material. In certain embodiments, the composition further includes scatterers in amount in the range from about 0.001 to about 15 weight percent based on the weight of the host material. In certain embodiments, at least a portion of the nanoparticles include a ligand on a surface thereof wherein the ligand has an affinity for the host material.

In accordance with another aspect of the present invention, there is provided a film comprising a carrier substrate including a predetermined arrangement of quantum confined semiconductor nanoparticles over a predetermined portion of a surface thereof, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the nanoparticles are included in a layer disposed over a surface of the film. In certain embodiments, the quantum confined semiconductor nanoparticles included in a layer are arranged in one or more predetermined arrangements. In certain embodiments, the carrier substrate comprises a substantially optically transparent material. In certain embodiments, the film includes from about 0.001 to about 15 weight percent quantum confined semiconductor nanoparticles based on the weight of the film. In certain embodiments, the predetermined arrangement further comprises scatterers. In certain embodiments, the nanoparticles are included in a host material. In certain embodiments, the nanoparticles are included in the composition in amount in the range from about 0.001 to about 15 weight percent based on the weight of the host material. Preferably the host material comprises a solid (as opposed to a liquid) material. In certain embodiments, the composition further comprises scatterers. In certain embodiments, the film comprises a decal. In certain embodiments, the film is adapted to be fixedly attached to a surface. In certain embodiments, the film is adapted to be removably attached to a surface. In certain embodiments, a film is included in an optical component wherein it is attached to a surface of a waveguide component. In certain embodiments, additional layers and/or features (including, but not limited to, filters, reflective layers, coupling means, etc.) are also included. In certain embodiments, a film is included in a device.

In accordance with another aspect of the present invention, there is provided a kit comprising a light source adapted for being optically coupled to a waveguide component and one or more films, wherein at least one film comprises a carrier substrate including quantum confined semiconductor nanoparticles disposed over a surface thereof, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the nanoparticles are disposed in a predetermined arrangement over a predetermined region of the carrier substrate. In certain embodiments, the film includes from about 0.001 to about 15 weight percent quantum confined semiconductor nanoparticles based on the weight of the film. In certain embodiments, the nanoparticles are included in a host material. In certain embodiments, the nanoparticles are included in the host material in amount in the range from about 0.001 to about 15 weight percent based on the weight of the host material. Preferably the host material comprises a solid (as opposed to a liquid) material. In certain embodiments, the host material further comprises scatterers. In certain embodiments, the film comprises a decal. In certain embodiments, the film is adapted to be fixedly attached to a surface. In certain embodiments, the film is adapted to be removably attached to a surface. In certain embodiments, a kit includes a light source adapted for being optically coupled to a waveguide component and one or more films, wherein at least one film comprises a film taught herein including nanoparticles disposed on a surface of the carrier substrate. In certain embodiments, a kit further includes a waveguide component.

In accordance with another aspect of the present invention, there is provided a thin film electroluminescent lamp comprising quantum confined semiconductor nanoparticles disposed over a surface thereof, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the nanoparticles are disposed in a predetermined arrangement over a predetermined region of the surface of the lamp. In certain embodiments, the nanoparticles are included in a host material. In certain embodiments, the host material further includes scatterers. In certain embodiments, the host material includes from about 0.001 to about 15 weight percent quantum confined semiconductor nanoparticles based on the weight of the host material. Preferably the host material comprises a solid (as opposed to a liquid) material. In certain embodiments, the nanoparticles are included in a layer disposed over a surface of the lamp. In certain embodiments, the layer further comprises a host material in which the quantum confined semiconductor nanoparticles are distributed. In certain embodiments, the quantum confined semiconductor nanoparticles included in a layer are arranged in one or more predetermined arrangements. In certain embodiments, the layer further includes scatterers. In certain embodiments, the layer further includes a host material, wherein the layer includes from about 0.001 to about 15 weight percent quantum confined semiconductor nanoparticles based on the weight of the host material. In certain embodiments, the host material further includes scatterers. In certain embodiments, the scatterers are included in amount in the range from about 0.001 to about 15 weight percent based on the weight of the host material. In certain embodiments, the scatterers are included in amount in the range from about 0.1 to 2 weight percent based on the weight of the host material. In certain embodiments, the weight ratio of quantum confined semiconductor nanoparticles to scatterers is from about 1:100 to about 100:1. In certain embodiments, the lamp can further include one or more filter layers. Such filters can be disposed over and/or under the nanoparticles. In certain embodiments, the lamp further includes one or more reflective layers. In certain embodiments, the lamp further includes outcoupling features on a surface of the lamp over which the nanoparticles are disposed. In certain embodiments, the lamp further includes outcoupling features over the nanoparticles. In certain embodiments, additional layers and/or features (including, but not limited to, filters, reflective layers, coupling means, brightness enhancing films, etc.) are also included. In certain embodiments, a TFEL lamp includes a film taught herein over surface thereof. In certain embodiments, the film comprises a decal.

In accordance with another aspect of the invention, there is provided an ink composition comprising quantum confined semiconductor nanoparticles and a liquid vehicle, wherein at least a portion of the nanoparticles include one or more chemically distinct ligands attached to a surface thereof, at least one of said ligands being represented by the formula: X-Sp-Z, as described herein, wherein the liquid vehicle comprises a composition including one or more functional groups that are capable of being cross-linked. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include scatterers.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the transition of ink from a liquid to a solid occurs merely by the evaporation of solvent, and no cross-linking occurs.

In accordance with another aspect of the invention, there is provided an ink composition comprising quantum confined semiconductor nanoparticles, a liquid vehicle, and scatterers, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In accordance with other aspects of the present invention, there are provided devices including a composition and/or ink composition taught herein. In certain embodiments, the ink and/or or composition is included in a component of the device. In certain embodiments, the ink and/or composition is included on a surface of a component. In certain embodiments, the ink and/or composition can be included as a layer in the device. In certain embodiments, the ink and/or composition is included on a top and/or bottom surface of the device. The ink and/or composition can be included in a predetermined arrangement over a predetermined region of the surface on which it is disposed. Such arrangement can be patterned or unpatterned, in accordance, with the particular application. In certain embodiments, more than one predetermined arrangement is included. In certain embodiments, the device comprises a display, a solid state lighting device, another light emitting device, a photovoltaic device, or other electronic or optoelectronic device.

As used herein, "native ligand" refers to a ligand that attaches or coordinates to a nanoparticle surface during the growth or overcoating thereof. Ligands are considered chemically distinct when they have different chemical compositions.

As discussed above, in certain embodiments, Z does not render the nanoparticle dispersible in a liquid medium that includes water.

In certain embodiments, a reactive group can comprise a functional, bifunctional, or polyfunctional reagent, and/or a reactive chemical group.

As used herein, "reactive chemical group" refers to a chemical group that can react with one or more other groups or species. Examples of reactive chemical groups include functional substituent groups. Examples of functional substituent groups include, but are not limited to, thiol, carboxyl, hydroxyl, amino, amine, sulfo, bifunctional groups, polyfunctional groups, etc.)

In certain embodiments, a cyclic group can comprise a saturated or unsaturated cyclic (including, but not limited to, a single ring, a bicyclic structure, a multi-cyclic structure, etc.) compound or aromatic compound. In certain embodiments, the cyclic group can include at least one hetero-atom. In certain embodiments, the cyclic group can include at least one substituent group (including, for example, but not limited to, a reactive chemical group, an organic group (alky, aryl, etc.), etc.). Other examples of cyclic groups are provided herein.

In certain embodiments, a halogenated group can comprise a fluorinated group, a perfluorinated group, a chlorinated group, a perchlorinated group, a brominated group, a perbrominated group, an iodinated group, a periodinated group, etc. Other examples of halogenated groups are provided herein.

In certain embodiments, a polar a-protic group can comprise a ketone, aldehyde, amide, urea, urethane, or an imine. Other examples of polar a-protic groups are provided herein.

In certain embodiments, a nanoparticle can comprise a core comprising a first material and a shell (or coating material) disposed over at least a portion of a surface of the core, the shell comprising a second material. In certain embodiments, the first material comprises a semiconductor material. In certain embodiments, the second material comprises a semiconductor material. In certain embodiments, one or more additional shells are disposed over at least a portion of a surface of the shell.

In certain preferred embodiments, a nanoparticle comprises a semiconductor nanocrystal. (A quantum confined semiconductor nanoparticle and a semiconductor nanocrystal is also referred to herein as a quantum dot.) In certain embodiments, the semiconductor nanocrystal can comprise a core comprising a first material and a shell (or coating material) disposed over at least a portion of a surface of the core, the shell comprising a second material. Preferably, the second material comprises a nanocrystalline semiconductor material. In certain embodiments, one or more additional shells are disposed over at least a portion of a surface of the shell. Additional discussion of nanoparticles and semiconductor nanocrystals is provided elsewhere herein.

Preferred ligands comprise benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3,5-di-tert-butyl-4-hydroxybenzylphosphonic acid, a conjugate base of the acid, or a mixture of the foregoing.

Other preferred ligands include ligands being represented by the formula X-Sp-Z comprising an organic amine including a terminal hydroxyl group or a fluorinated organic amine.

In certain preferred embodiments, a nanoparticle comprises a semiconductor nanocrystal core comprising a first semiconductor material having an overcoating material comprising a second semiconductor material disposed on at least a portion of a surface of the core, wherein the overcoating material is grown thereon in the presence of one or more of the ligands described herein.

As discussed above, in certain embodiments, a nanoparticle can include two or more chemically distinct ligands attached to a surface thereof, at least one of said ligands being represented by the formula: X-Sp-Z, as described herein.

In certain embodiments, one or both of such ligands comprises a native ligand.

As also discussed above, in certain embodiments, a nanoparticle can include two or more chemically distinct ligands attached to a surface thereof, a first ligand is represented by the formula: N-Sp-Z, as described herein; and a second ligand is represented by the formula: Y-Sp-Z, as described herein.

In certain embodiments, one or both of such ligands comprises a native ligand.

The nanoparticle can be as described above and elsewhere herein.

The foregoing, and other aspects and embodiments described herein and contemplated by this disclosure all constitute embodiments of the present invention.

It is to be understood that both, the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
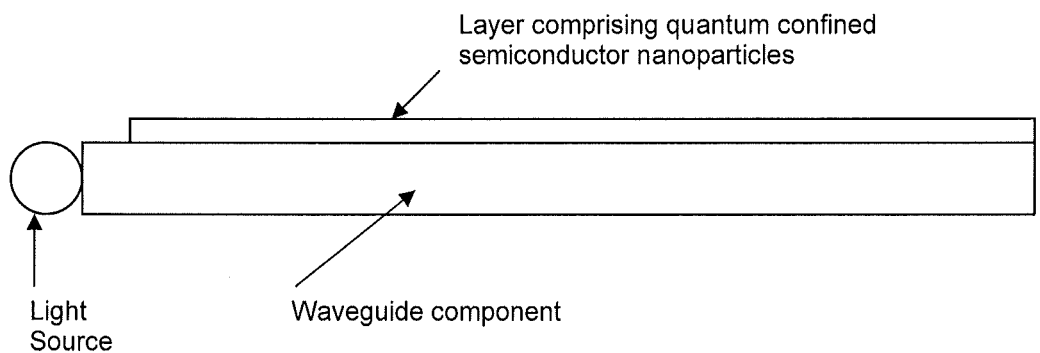
FIG. 1 is a schematic drawing depicting an example of an embodiment of a system including an example of an embodiment of an optical component in accordance with the invention.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

The present inventions relate to optical components which include quantum confined semiconductor nanoparticles, wherein at least a portion of the nanoparticles include a ligand attached to a surface thereof, the ligand being represented by the formula:

X-Sp-Z wherein:

X represents a primary amine group, a secondary amine group, a urea, a thiourea, an imidizole group, an amide group, an other nitrogen containing group, a carboxylic acid group, a phosphonic or arsonic acid group, a phosphinic or arsinic acid group, a phosphate or arsenate group, a phosphine or arsine oxide group;

Sp represents a spacer group, such as a group capable of allowing a transfer of charge or an insulating group; and Z represents: (i) a reactive group capable of communicating specific chemical properties to the nanocrystal as well as provide specific chemical reactivity to the surface of the nanocrystal, and/or (ii) a group that is cyclic, halogenated, or polar a-protic. In certain embodiments, Z in all cases is not reactive upon exposure to light. In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein. In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein. In certain embodiments, one or both of such ligands comprises a native ligand.

In accordance with one aspect of the invention, there is provided a composition comprising a host material and quantum confined semiconductor nanoparticles, wherein the nanoparticles are included in the composition in amount in the range from about 0.001 to about 15 weight percent based on the weight of the host material and wherein at least a portion of the nanoparticles include one or more chemically distinct ligands attached to a surface thereof, at least one of said ligands being represented by the formula:

X-Sp-Z as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands, comprises a native ligand.

In certain preferred embodiments, the composition includes from about 0.01 to about 10 weight percent quantum confined semiconductor nanoparticles based on the weight of the host material. In certain more preferred embodiments, the composition includes from about 0.01 to about 5 weight percent quantum confined semiconductor nanoparticles based on the weight of the host material. In certain most preferred embodiments, the composition includes from about 0.1 to about 3 weight percent quantum confined semiconductor nanoparticles based on the weight of the host material. In certain of such most preferred embodiments, the composition includes from about 0.1 to about 2 weight percent quantum confined semiconductor nanoparticles based on the weight of the host material.

In certain embodiments, the quantum confined semiconductor nanoparticles comprise semiconductor nanocrystals. In certain embodiments, the semiconductor nanocrystals comprise a core/shell structure.

In certain embodiments, the composition further includes scatterers. In certain embodiments, the scatterers are also included in the composition in amount in the range from about 0.001 to about 15 weight percent based on the weight of the host material. In certain embodiments, the scatterer concentration is from about 0.1 to 2 weight percent based on the weight of the host material. In certain embodiments, the weight ratio of quantum confined semiconductor nanoparticles to scatterers is from about 1:100 to about 100:1.

Examples of scatterers (also referred to herein as light scattering particles) that can be used in the embodiments and aspects of the inventions contemplated by this disclosure, include, without limitation, metal or metal oxide particles, air bubbles, and glass and polymeric beads (solid or hollow). Other scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. Additionally, scatterers that aid in the out-coupling of the down-converted light may be used. These may or may not be the same scatterers used for increasing the absorption pathlength. In certain embodiments, the scatterers may have a high index of refraction (e.g., $TiO_2$, $BaSO_4$, etc) or a low index of refraction (gas bubbles). Preferably the scatterers are not luminescent.

Selection of the size and size distribution of the scatterers is readily determinable by those of ordinary skill in the art. The size and size distribution is preferably based upon the refractive index mismatch of the scattering particle and the host material in which it the scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 μm particle size, in a concentration in a range from about 0.001 to about 20% by weight. In certain preferred embodiments, the concentration range of the scatterers is between 0.1% and 10% by weight. In certain more preferred embodiments, a composition includes a scatterer (preferably comprising $TiO_2$) at a concentration in a range from about 0.1% to about 5% by weight, and most preferably from about 0.3% to about 3% by weight.

Examples of a host material useful in various embodiments and aspect of the inventions described herein include polymers, monomers, resins, binders, glasses, metal oxides, and other nonpolymeric materials. In certain embodiments, the host material is non-photoconductive. In certain embodiments, an additive capable of dissipating charge is further included in the host material. In certain embodiments, the charge dissipating additive is included in an amount effective to dissipate any trapped charge. In certain embodiments, the host material is non-photoconductive and further includes an additive capable of dissipating charge, wherein the additive is included in an amount effective to dissipate any trapped charge. Preferred host materials include polymeric and non-polymeric materials that are at least partially transparent, and preferably fully transparent, to preselected wavelengths of visible and non-visible light. In certain embodiments, the preselected wavelengths can include wavelengths of light in the visible (e.g., 400-700 nm), ultraviolet (e.g., 10-400 nm), and/or infrared (e.g., 700 nm-12 μm) regions of the electromagnetic spectrum. Preferred host materials include cross-linked polymers and solvent-cast polymers. Examples of preferred host materials include, but are not limited to, glass or a transparent resin. In particular, a resin such as a non-curable resin, heat-curable resin, or photocurable resin is suitably used from the viewpoint of processability. As specific examples of such a resin, in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art.

In certain embodiments and aspects of the inventions contemplated by this disclosure, a host material comprises a photocurable resin. A photocurable resin may be a preferred host material in certain embodiments in which the composition is to be patterned. As a photo-curable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the invention contemplated by this disclosure, a host material comprises a solvent-cast resin. A polymer such as a polyurethane resin, a maleic resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles. In certain embodiments, the composition including quantum confined semiconductor nanoparticles and a host material can be formed from an ink composition comprising quantum confined semiconductor nanoparticles and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include scatterers.

In certain embodiments of the inventions contemplated by this disclosure, quantum confined semiconductor nanoparticles (e.g., semiconductor nanocrystals) described herein are distributed within the host material as individual particles.

In certain embodiments of the inventions contemplated by this disclosure, quantum confined semiconductor nanoparticles described herein are distributed within the host material may include flocculated (or aggregated) particles.

In certain embodiments of the inventions contemplated by this disclosure, quantum confined semiconductor nanoparticles described herein may be included within or adsorbed onto host particles. These host particles may be polymeric or inorganic. These host particles can be dispersed within or on top of the host material.

In accordance with another aspect of the invention, there is provided a film comprising a carrier substrate including a predetermined arrangement of quantum confined semiconductor nanoparticles over a predetermined region of a surface thereof, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the film includes from about 0.001 to about 15 weight percent quantum confined semiconductor nanoparticles based on the weight of the film.

In certain embodiments, the quantum confined semiconductor nanoparticles are included directly or indirectly on a predetermined region of a surface of the carrier substrate in a predetermined arrangement.

In certain embodiments, the quantum confined semiconductor nanoparticles are included in the host material in an amount in the range from about 0.001 to about 15 weight percent of the weight of the host material. Preferably the host material comprises a solid (as opposed to a liquid) material. In certain embodiments, scatterers are included with the nanoparticles.

In certain embodiments, the quantum confined semiconductor nanoparticles are included in a layer disposed over a surface of the film. In certain embodiments, the quantum confined semiconductor nanoparticles included in a layer are arranged in one or more predetermined arrangements. In certain embodiments, the layer further comprises a host material in which the quantum confined semiconductor nanoparticles are distributed.

In certain embodiments, additional layers and/or features (including, but not limited to, filters, reflective layers, coupling means, etc.) are also included. Examples of various additional layers and/or features discussed herein for inclusion in an optical component or with a waveguide components can also be included in a film. In certain embodiments, the film comprises a decal.

In accordance with another aspect of the invention, there is provided an optical component comprising a waveguide component and quantum confined semiconductor nanoparticles, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein. In certain embodiments, one or both of such ligands comprise a native ligand.

In certain embodiments, one or both of such ligands, comprises a native ligand.

In certain embodiments, quantum confined semiconductor nanoparticles can be included in a host material. In certain embodiments, the quantum confined semiconductor nanoparticles described herein are included in a composition in accordance with the present invention.

In certain embodiments, the quantum confined semiconductor nanoparticles are included directly or indirectly on a predetermined region of a surface of the waveguide component in a predetermined arrangement.

In the various aspects and embodiments of the inventions contemplated by this disclosure, a predetermined arrangement can be of any configuration or content. For example, the predetermined arrangement can display any type of image (e.g., logo, design, picture, other graphics, text (e.g., letters, words, numbers, combinations of letter, words and/or numbers), and/or combinations thereof (e.g., a combination of a logo, design, picture, other, graphics, and/or text). Alternatively, the predetermined arrangement can be a layer that fully or partially covers a predetermined region. In certain embodiments, a second predetermined arrangement can be further disposed over and/or under a first predetermined arrangement. In certain embodiments, the second predetermined arrangement comprises quantum confined semiconductor nanoparticles. In certain embodiments including more than one predetermined arrangement, a predetermined arrangement can comprise an opaque or other non-emissive material that can useful, for example, the brightness of the quantum confined semiconductor nanoparticle background layer can enhance the details, contrast or other visibility aspects of one or more of any other predetermined arrangement. The predetermined arrangement is typically disposed over a surface of a component or device that is viewable when the component or device is in use, whether or not included in or on another device, product, or other article.

In certain embodiments including two or more predetermined arrangements, the arrangements may be positioned to have different orientations. For example, one may be positioned for intended viewing in a first orientation, and another is positioned for intended viewing at a second orientation, e.g., at a 90 degree rotation from the first.

Quantum confined semiconductor nanoparticles can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

In certain embodiments, quantum confined semiconductor nanoparticles include at least one type of quantum confined semiconductor nanoparticle with respect to chemical composition and size. The type(s) of quantum confined semiconductor nanoparticles included in one of the aspects or embodiments of the inventions contemplated by this disclosure are determined by the wavelength of light to be converted and the wavelengths of the desired light output. As discussed herein, quantum confined semiconductor nanoparticles may or may not include a shell. A shell and/or ligand on quantum confined semiconductor nanoparticles can serve to passivate non-radiative defect sites, and to prevent agglomeration or aggregation to overcome the Van der Waals binding force between the nanoparticles. In certain embodiments, the ligand can comprise a material having an affinity for any host material in which a quantum confined semiconductor nanoparticle may be included. As discussed herein, in certain embodiments, a shell comprises an inorganic shell.

The size and composition of the quantum confined semiconductor nanoparticles can be selected such that the nanoparticles emit photons at a predetermined wavelength.

For example, a predetermined arrangement can include quantum confined semiconductor nanoparticles that emit light at the same or different wavelengths.

In a monochromatic embodiment, the quantum confined semiconductor nanoparticles are selected to emit at a predetermined wavelength or wavelength band for the desired color upon absorption of excitation light.

In a multi-color or polychromatic embodiment, for example, the quantum confined semiconductor nanoparticles are selected to emit two or more different predetermined wavelengths for the desired light output when excited by optical energy from one or more light sources. The quantum confined semiconductor nanoparticles can further be arranged according to the wavelength or wavelength band of their emission in accordance with a predetermined arrangement.

The quantum confined semiconductor nanoparticles included in various aspects and embodiments of the inventions contemplated by this disclosure are preferably members of a population of quantum confined semiconductor nanoparticles having a narrow size distribution. More preferably, the quantum confined semiconductor nanoparticles comprise a monodisperse or substantially monodisperse population of quantum confined semiconductor nanoparticles.

The quantum confined semiconductor nanoparticles included in various aspects and embodiments of the inventions contemplated by this disclosure preferably have high emission quantum efficiencies such as greater than 30%, 40%, 50%, 60%, 70%, 80%, or 90%.

In certain embodiments, an optical component of the invention is useful, when optically coupled to a light source, for displaying one or more illuminated patterns that correspond to the one or more predetermined arrangements of quantum confined semiconductor nanoparticles included in the optical component.

In certain embodiments and aspects of the inventions contemplated by this disclosure, under ambient light conditions (e.g., when not optically excited by waveguided light from one or more light sources), the predetermined arrangement is not visibly emissive and is substantially transparent (<0.1 Abs units across the visible spectrum, or transmission>90% across the visible spectrum).

Quantum confined semiconductor nanoparticles included in certain embodiments of the inventions contemplated by this disclosure are useful, when optically coupled to a light source, for altering the wavelength of at least a portion of light emitted from the light source.

In these applications, quantum confined semiconductor nanoparticles are selected to have a bandgap smaller than the energy of at least a portion of the original light emitted from the light source. In certain embodiments, more than one light source can be optically coupled to an optical component.

In certain embodiments, an optical component includes a waveguide component including at least one feature, wherein the feature comprises a composition comprising a host material for the quantum confined semiconductor nanoparticles. Optionally, scatterers and/or other additives can also be included in the composition.

In certain embodiments, an optical component includes at least one layer including quantum confined semiconductor nanoparticles. In certain embodiments, the quantum confined semiconductor nanoparticles included in the layer are arranged in one or more predetermined arrangements. Examples of compositions for inclusion in a layer in which the quantum confined semiconductor nanoparticles may be included are described herein.

In certain embodiments, an optical component includes at least one such layer disposed directly or indirectly on a surface of the waveguide component.

In certain embodiments, an optical component includes at least one such layer disposed between the waveguide component and other optional layers that may be included on the waveguide component.

In certain embodiments, an optical component includes at least one such layer disposed between two separate waveguide components. (Other optional layers may also be included.)

In certain embodiments of an optical component includes a layer comprising a composition in accordance with the invention. In certain embodiments, at least one feature is disposed on a surface of the waveguide component.

In certain embodiments, at least one feature is embedded in the waveguide component.

In certain embodiments, one feature can have dimensions selected such that the feature covers all or a predetermined portion of a surface of the waveguide component.

In certain embodiments, a plurality of features is disposed on the waveguide component.

In certain embodiments, a plurality of features is embedded in the waveguide component.

In certain embodiments, the waveguide component includes one or more recesses, and at least one feature is included in one of the recesses.

In certain embodiments including a plurality of features, a portion of the features can be disposed on a surface of the waveguide component and a portion of the features can be embedded in the waveguide component. In certain embodiments, the features are arranged in a predetermined arrangement.

In certain embodiments including a plurality of features, each feature can comprise the same or different types of quantum confined semiconductor nanoparticles.

In certain embodiments including a plurality of features, the plurality of features can be arranged in a pattern. In certain of such embodiments, each feature can have a shape that is the same or similar to the shape of the other features. In certain of such embodiments, the shapes of all of the features need not be the same or similar.

In certain embodiments including a plurality of features, each feature can have size dimensions (e.g., length, width, and thickness) that are the same or similar to that of the other features. In certain embodiments, the size of all of the features need not be the same or similar.

In certain embodiments, a feature can have a thickness from about 0.1 to about 200 microns.

In certain embodiments, the features can be spatially dithered.

Dithering or spatial dithering is a term used, for example, in digital imaging to describe the use of small areas of a predetermined palette of colors to give the illusion of color depth. For example, white is often created from a mixture of small red, green and blue areas. In certain embodiments, using dithering of compositions including different types of quantum confined semiconductor nanoparticles (wherein each type is capable of emitting light of a different color) disposed on and/or embedded in a surface of a waveguide component can create the illusion of a different color. In certain embodiments, a waveguide component that appears to emit white light can be created from a dithered pattern of features including, for example, red, green and blue-emitting quantum confined semiconductor nanoparticles. Dithered color patterns are well known. In certain embodiments, the blue light component of the white light can comprise outcoupled unaltered blue excitation light and/or excitation light that has been down-converted by quantum confined semiconductor nanoparticles included in the waveguide component, wherein the nanoparticles comprise a composition and size preselected to down-convert the excitation light to blue.

In certain embodiments, white light can be obtained by layering compositions including different types of quantum confined semiconductor nanoparticles (based on composition and size) wherein each type is selected to obtain light having a predetermined color.

In certain embodiments, white light can be obtained by including different types of quantum confined semiconductor nanoparticles (based on composition and size) in a host material, wherein each type is selected to obtain light having a predetermined color.

In certain embodiments, a composition comprising a host material and quantum confined semiconductor nanocrystals is preferably, hardened after it is applied to, or embedded in, a surface of a waveguide component. For example, in certain embodiments, the composition may be applied in a molten state which can harden upon cooling; it may be uv-, thermal-, chemically- or otherwise curable and cured after being applied to, or embedded in, a surface of a waveguide component, etc.

In certain embodiments, an optical component comprises a film including a carrier substrate including quantum confined semiconductor nanoparticles disposed over a surface thereof wherein the film is attached to a surface of a waveguide component. In certain embodiments, the film comprises a decal.

The descriptions herein relating to quantum confined semiconductor nanoparticles, compositions including quantum confined semiconductor nanoparticles, and the application thereof to a waveguide component (e.g., arrangements, thicknesses, multiple-colors, etc.) also apply to a carrier substrate and other aspects and embodiments of the inventions contemplated by this disclosure.

In certain embodiments, a carrier substrate can further include any one or more of the additional layers, structures, components, or other features described herein or otherwise contemplated by this disclosure as a further feature with a waveguide component in the various aspect and embodiments of an optical component in accordance with the invention.

In certain embodiments, quantum confined semiconductor nanoparticles are disposed over a predetermined region of a surface of the carrier substrate in a predetermined arrangement. In certain embodiments, the quantum confined semiconductor nanoparticles are included in a layer disposed over a predetermined region of a surface of the carrier substrate. In certain embodiments, the quantum confined semiconductor nanoparticles included in a layer are arranged in one or more predetermined arrangements.

In certain embodiments the carrier substrate can comprise a rigid material, e.g., glass, polycarbonate, acrylic, quartz, sapphire, or other known rigid materials with waveguide component characteristics.

In certain embodiments, the carrier substrate can comprise a flexible material, e.g., a polymeric material such as plastic or silicone (e.g. but not limited to thin acrylic, epoxy, polycarbonate, PEN, PET, PE).

Preferably, at least one, and more preferably two, of the major surfaces of the carrier substrate is smooth.

Preferably the carrier substrate is substantially optically transparent, and more preferably at least 99% optically transparent to the source light, per mm of waveguide pathlength.

In certain embodiments, the geometrical shape and dimensions of a carrier substrate can be selected based on the particular end-use application. In certain embodiments, the thickness of the carrier substrate is substantially uniform. In certain embodiments, the thickness of the carrier substrate is non-uniform (e.g., tapered).

Preferably, the carrier substrate comprises a thin flexible component. In certain embodiments, the thickness of the carrier substrate is less than or equal to about 1000 microns. In certain embodiments, the thickness of the carrier substrate is less than or equal to about 500 microns. In certain embodiments, the thickness of the carrier substrate is in a range from 10 to about 200 microns.

In certain embodiments, the film comprises a decal. In certain embodiments, a decal is fixedly attachable to a surface. Examples of techniques for fixedly attaching the decal to a surface include, without limitation, permanent adhesive, lamination, or other fixed attachment techniques. In certain embodiments, the decal can be removably attached to or repositioned on a surface. Examples of techniques for removably attaching the decal to a surface include use of a low-tack adhesive (e.g., 3M Post-it Note glue, etc.), use of a static cling-type material as the carrier substrate, or other removable attachment techniques. Preferably the technique or materials used to attach a decal to a surface are optically transparent or substantially optically transparent.

In certain embodiments, an underlying filter is disposed between the quantum confined semiconductor nanoparticles (whether or not included in a host material) and the waveguide component. In certain embodiments, an underlying filter covers all or at least a predetermined region of the waveguide component beneath one or more features. Preferably the underlying filter is capable of passing of one or more predetermined wavelengths of light, and can absorb or optionally reflect other wavelengths.

In certain embodiments, an overlying filter material is disposed over the surface of one or more of the features that is opposite the waveguide component. Preferably the overlying filter is capable passing one or more predetermined wavelengths of light, and can absorb or optionally reflect other wavelengths.

In certain embodiments, an optical component includes multiple filter layers on various surfaces of the waveguide component.

In certain embodiments, an optical component can further include one or more coupling members or structures that permit at least a portion of light emitted from a light source to be optically coupled from the light source into the waveguide component. Such members or structures include, for example, and without limitation, members or structures that are attached to a surface of the waveguide component, protrude from a surface of the waveguide component (e.g., prisms, gratings, etc.), are at least partially embedded in the waveguide component, or are positioned at least partially within a cavity in the waveguide component.

Figure 3:
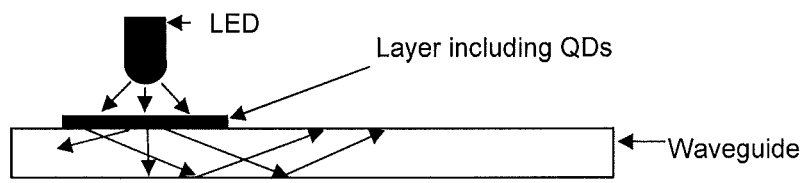
FIG. 3 is a schematic drawing depicting an example of an embodiment of the present invention.

In certain embodiments, a coupling member or structure can comprise quantum confined semiconductor nanoparticles. In such embodiments, quantum confined semiconductor nanoparticles can enhance coupling of light to the waveguide component. In these embodiments, coupling of light to the waveguide component can be especially enhanced when such nanoparticles are disposed on a surface, preferably a major surface, of the waveguide component. An example of such embodiment is schematically depicted in FIG. 3. In certain embodiments, such nanoparticles can be included in a composition in accordance with embodiments of the inventions described herein.

In certain embodiments of the inventions taught herein, for example, outcoupling members or structures may also be included. In certain embodiments, they can be distributed across a surface of the waveguide component or the top layer of the optical component or film. In certain preferred embodiments, such distribution is uniform or substantially uniform. In certain embodiments, coupling members or structures may vary in shape, size, and/or frequency in order to achieve a more uniform light distribution. In certain embodiments, coupling members or structures may be positive, i.e., sitting above the surface of the waveguide, or negative, i.e., depressed into the surface of the waveguide, or a combination of both. In certain embodiments, one or more features comprising a composition including a host material and quantum confined semiconductor nanoparticles can be applied to a surface of a positive coupling member or structure and/or within a negative coupling member or structure.

In certain embodiments, coupling members or structures can be formed by molding, embossing, lamination, applying a curable formulation (formed, for example, by techniques including, but not limited to, spraying, lithography, printing (screen, inkjet, flexography, etc), etc.)

In certain embodiments, quantum confined semiconductor nanoparticles described herein are included in the waveguide component in an amount in the range from about 0.001 to about 15 weight percent based on the weight of the waveguide component. In certain preferred embodiments, the waveguide component includes from about 0.01 to about 10 weight percent quantum confined semiconductor nanoparticles based on the weight of the waveguide component. In certain more preferred embodiments, the waveguide component includes from about 0.01 to about 5 weight percent quantum confined semiconductor nanoparticles based on the weight of the waveguide component. In certain most preferred embodiments, the waveguide component includes from about 0.1 to about 2 weight percent quantum confined semiconductor nanoparticles based on the weight of the waveguide component. In certain embodiments, quantum confined semiconductor nanoparticles can be distributed within the waveguide component.

In certain embodiments, quantum confined semiconductor nanocrystals can be distributed in a predetermined region of the waveguide component. In certain embodiments, the distribution of quantum confined semiconductor nanoparticles can be substantially uniform throughout the predetermined region of the waveguide component. In certain embodiments, the concentration of quantum confined semiconductor nanoparticles throughout the predetermined region of the waveguide component can be non-uniform (e.g., graded).

In certain embodiments, quantum confined semiconductor nanocrystals can be distributed throughout the entire waveguide component. In certain embodiments, the distribution of quantum confined semiconductor nanoparticles can be substantially uniform throughout the entire waveguide component. In certain embodiments, the concentration of quantum confined semiconductor nanoparticles throughout the waveguide component can be non-uniform (e.g., graded).

In certain embodiments, scatterers are also distributed within the waveguide component. In certain embodiments, scatterers are included in an amount in the range from about 0.001 to about 15 weight percent of the weight of the waveguide component. In certain embodiments, additional additives can be included within the waveguide component (e.g., without limitation additional surfactants, defoaming agents).

In certain embodiments, the quantum confined semiconductor nanoparticles are included in a layer disposed over a surface of the waveguide component.

In certain embodiments, the layer has a thickness from about 0.1 to about 200 microns.

In certain embodiments, the layer further comprises a host material in which the quantum confined semiconductor nanoparticles are distributed.

In certain embodiments, quantum confined semiconductor nanoparticles are included in the layer in an amount in the range from about 0.001 to about 15 weight percent of the weight of the host material. In certain preferred embodiments, the layer includes from about 0.01 to about 10 weight percent quantum confined semiconductor nanoparticles based on the weight of the host material. In certain more preferred embodiments, the layer includes from about 0.01 to about 5 weight percent quantum confined semiconductor nanoparticles based on the weight of the host material. In certain most preferred embodiments, the layer includes from about 0.1 to about 2 weight percent quantum confined semiconductor nanoparticles based on the weight of the host material.

In certain embodiments, the host material can comprise a polymer, monomer, resin, binder, glass, metal oxide or other nonpolymeric material. Other examples of host materials are described herein. In certain embodiments, the quantum confined semiconductor nanoparticles are uniformly dispersed in the layer. In certain embodiments, the quantum confined semiconductor nanoparticles are non-uniformly dispersed in the layer.

In certain embodiments, scatterers are also included in the layer. In certain embodiments, scatterers are included in the layer in an amount in the range from about 0.001 to about 15 weight percent of the weight of the host material.

In certain embodiments, the quantum confined semiconductor nanoparticles are contained or dispersed within a host material particle, vesicle, microcapsule or the like. Such microcapsules can also be prepared using a technique such as that described in "Preparation of lipophilic dye-loaded poly(vinyl alcohol) microcapsules and their characteristics, by Budriene et al, 2002. In certain embodiments, the nanoparticles may be included in particles such as those described in U.S. Application No. 61/033,729, filed 4 Mar. 2008, of John R. Linton for "Particles Including Nanoparticles, Uses Thereof, and Methods", which is hereby incorporated herein be reference in its entirety. Other techniques readily ascertainable by one of ordinary skill in the relevant can be used. An example of a preferred encapsulant system includes PVA and a squalane solvent. Microencapsulation may be a preferred approach to dispersing the semiconductor nanoparticles within the host material in order to improve the packaging (gas permeability properties) or material properties (index of refraction, scattering, etc). Microencapsulation may also be preferred if handling individual nanoparticles is not desired, for example, during processing. These host material particles, vesicles, microcapsules or the like can have various shapes from spherical to irregular, and can range in size from 100 nm to 100 μm in diameter. These particles can then be distributed uniformly or non-uniformly throughout the host material.

Optionally other additives (including, but not limited to, UV absorbers, etc.) can be included in the layer.

In certain embodiments, a plurality of layers comprising quantum confined semiconductor nanoparticles is disposed over a surface of the waveguide component. In certain embodiments, additional additives can be included within the waveguide component (e.g., without limitation additional surfactants, defoaming agents, scatterers).

In certain embodiments, the waveguide component includes a layer comprising quantum confined semiconductor nanoparticles disposed as a patterned layer over a predetermined region of a surface of the waveguide component. In certain preferred embodiments, the layer comprising quantum confined semiconductor nanoparticles are arranged in predetermined pattern wherein the quantum confined semiconductor nanoparticles are selected and tuned to emit photons of one or more predetermined wavelengths in response to absorption of light.

In certain embodiments, the waveguide component includes a layer comprising quantum confined semiconductor nanoparticles disposed as an unpatterned layer over a predetermined region of a surface of the waveguide component.

In certain embodiments, a film or layer comprising quantum confined semiconductor nanoparticles can be prepared separately from the waveguide component. It can then be adhered or laminated to the surface of the waveguide. The film or layer containing the quantum confined semiconductor nanoparticles can then be cut into a predetermined shape. In certain embodiments, the layer shape can be achieved by die-cutting. Such film or layer may further include a filter above and/or below, as part of the film or layer or as another part of the waveguide or optical component.

In certain embodiments and aspects of the inventions contemplated by this disclosure, the quantum confined semiconductor nanoparticles have an average particle size in a range from about 1 to about 100 nanometers (nm). In certain embodiments, the quantum confined nanoparticles have an average particle size in a range from about 1 to about 20 nm. In certain embodiments, the quantum confined semiconductor nanoparticles have an average particle size in a range from about 2 to about 10 nm.

In certain embodiments and aspects of the inventions contemplated by this disclosure including quantum confined semiconductor nanoparticles, at least a portion of the quantum confined semiconductor nanoparticles are capable of converting the wavelength of at least a portion of light coupled into the waveguide component from a light source to one or more predetermined wavelengths.

In certain embodiments and aspects of the inventions contemplated by this disclosure including quantum confined semiconductor nanoparticles, the quantum confined semiconductor nanoparticles comprise semiconductor nanocrystals. In certain embodiments the quantum confined semiconductor nanoparticles comprise semiconductor nanocrystals including a core/shell structure.

In certain preferred embodiments and aspects of the inventions contemplated by this disclosure including a waveguide component, the waveguide component is transparent to light coupled to the waveguide component from a light source and to light emitted by the quantum confined semiconductor nanoparticles.

In certain embodiments and aspects of the inventions contemplated by this disclosure including a waveguide component, the waveguide component can comprise a rigid material, e.g., glass, polycarbonate, acrylic, quartz, sapphire, or other known rigid materials with waveguide component characteristics.

In certain embodiments and aspects of the inventions contemplated by this disclosure that include a waveguide component, the waveguide components can alternatively comprise a flexible material, e.g., a polymeric material such as plastic or silicone (e.g. but not limited to thin acrylic, epoxy, polycarbonate, PEN, PET, PE).

In certain embodiments and aspects of the inventions contemplated by this disclosure that include a waveguide component, the waveguide component is planar.

In certain embodiments and aspects of the inventions contemplated by this disclosure that include a waveguide components, at least the texture of the surface of the waveguide component from which light is emitted is selected to enhance or otherwise alter the pattern, angle, or other feature of light transmitted therethrough. For example, in certain embodiments, the surface may be smooth; in certain embodiments, the surface may be non-smooth (e.g., the surface is roughened or the surface includes one or more raised and/or depressed features); in certain embodiments, the surface may include both smooth and non-smooth regions.

In certain embodiments and aspects of the inventions contemplated by this disclosure, the geometrical shape and dimensions of a waveguide component and/or an optical component can be selected based on the particular end-use application. In certain embodiments, the thickness of the waveguide component can be substantially uniform. In certain embodiments, the thickness of the waveguide can be non-uniform (e.g., tapered).

In certain embodiments and aspects of the inventions contemplated by this disclosure, at least 0.1% of the light coupled from the light source to the waveguide component is absorbed and reemitted by the quantum confined semiconductor nanoparticles. In certain embodiments, at least 10% of the light coupled from the light source to the waveguide component is absorbed and reemitted by the quantum confined semiconductor nanoparticles. In certain embodiments, at least 20% of the light coupled from the light source to the waveguide component is absorbed and reemitted by the quantum confined semiconductor nanoparticles. In certain embodiments, at least 30% of the light coupled from the light source to the waveguide component is absorbed and reemitted by the quantum confined semiconductor nanoparticles. In certain embodiments, at least 40% of the light coupled from the light source to the waveguide component is absorbed and reemitted by the quantum confined semiconductor nanoparticles. In certain embodiments, at least 50% of the light coupled from the light source to the waveguide component is absorbed and reemitted by the quantum confined semiconductor nanoparticles. In certain embodiments, at least 60% of the light coupled from the light source to the waveguide component is absorbed and reemitted by the quantum confined semiconductor nanoparticles. In certain embodiments, at least 70% of the light coupled from the light source to the waveguide component is absorbed and reemitted by the quantum confined semiconductor nanoparticles. In certain embodiments, at least 80% of the light coupled from the light source to the waveguide component is absorbed and reemitted by the quantum confined semiconductor nanoparticles. In certain embodiments, at least 90% of the light coupled from the light source to the waveguide component is absorbed and reemitted by the quantum confined semiconductor nanoparticles.

In certain embodiments and aspects of the inventions contemplated by this disclosure, an optical component comprises a thin flexible component. In certain embodiments, the thickness of the optical component is less than or equal to about 1000 microns. In certain embodiments, the thickness of the component is less than or equal to about 500 microns. In certain embodiments, the thickness of the component is in a range from 10 to about 200 microns.

In certain embodiments, an optical component further includes a coupling means for coupling light from a light source through an edge of the waveguide component. Examples of light sources include, but are not limited to, those listed below. In certain embodiments, more than one coupling means can be included for coupling more than one light source to the waveguide component.

In accordance with another aspect of the invention, there is provided a system comprising an optical component in accordance with the invention and a light source optically coupled to the waveguide component. In certain embodiments, the waveguide component includes from about 0.001 to about 15 weight percent quantum confined semiconductor nanoparticles based on the weight of the waveguide component. In certain embodiments, the waveguide component includes from about 0.01 to about 10 weight percent quantum confined semiconductor nanoparticles based on the weight of the waveguide component. In certain embodiments, the waveguide component includes from about 0.01 to about 5 weight percent quantum confined semiconductor nanoparticles based on the weight of the waveguide component. In certain embodiments, the waveguide component includes from about 0.1 to about 2 weight percent quantum confined semiconductor nanoparticles based on the weight of the waveguide component. In certain embodiments, the quantum confined semiconductor nanoparticles are included in a host material. In certain embodiments, the quantum confined semiconductor nanoparticles are included in a composition in accordance with the invention. In certain embodiments, the quantum confined semiconductor nanoparticles are included in one or more predetermined arrangements over a predetermined region of a surface of the waveguide component that is intended as the viewing surface.

Examples of light sources include, without limitation, solid state light emitting devices (e.g., an electroluminescent device or a thin film electroluminescent device TFEL (which are well know and available from numerous sources, including, for example, but not limited to, Durel, and Luminus Films http://www.luminousfilm.com/el_lamp.htm), an LED (e.g., an inorganic LED, such as an inorganic semiconductor LEDs, which are well known in the art and are available from numerous sources), a solid state laser, or other known solid state lighting device), a gas discharge lamp (e.g., a fluorescent lamp CCFL, a sodium vapor lamp, a metal halide lamp, a high pressure mercury lamp, a CRT), other laser devices. The above light sources are well know and available from numerous sources. A light source can emit in a visible or invisible (e.g., infrared, ultraviolet, etc.) region of the electromagnetic spectrum.

In certain embodiments, a system can include a single light source.

In certain embodiments, a system can include a plurality of light sources.

In certain embodiments including a plurality of light sources, the individual light sources can be the same or different.

In certain embodiments including a plurality of light sources, each individual light sources can emit light having a wavelength that is the same as or different from that emitted by each of the other light sources.

In certain embodiments including a plurality of light sources, the individual light sources can be arranged as an array.

In certain embodiments including a plurality of light sources, the individual light sources can optically coupled to introduce light into the same or different areas of the waveguide component.

In certain embodiments, a light source comprises a blue LEDs (e.g., (In)GaN blue) or a UV LEDs.

In certain embodiments, a light source or light source array is optically coupled to an edge of the waveguide component.

In one embodiment, a system can include two or more optical components of the invention. Such optical components are preferably arranged such that the waveguide component (preferably constructed from glass or other optically transparent material) of each is parallel to that of each other optical component, and each optical component is coupled to a separate light source. The optical components preferably are separated from each such that there is no "optical communication" between the optical components. Such separation can be achieved by an air gap due to physical spacing between the components or by a layer of lower refractive index. The two or more optical components can be mounted in a single base or frame or in multiple bases or frames. Each waveguide can include one or more predetermined arrangements of quantum confined semiconductor nanoparticles having predetermined emissive characteristics. The arrangement(s) of quantum confined semiconductor nanoparticles included in or on each optical component can be the same or different from that on another of the optical components. The light sources can be programmed or otherwise adapted to be lighted at the same time or on a time sequenced basis. For example, in a signage application, each optical component included in the system can have a different image (e.g., logo, text, drawing, picture, various combinations of the foregoing, or other predetermined arrangement.) Preferably the quantity and thickness of quantum confined semiconductor nanoparticles included in the arrangement thereof on one or all of the optical components are selected such that when the light source optically coupled thereto is not operational, the arrangement is substantially transparent to the viewer. In certain embodiments including two or more optical components, the optical components may be positioned to have different orientations. For example, one may be positioned for intended viewing in a first orientation, and another is positioned for intended viewing at a second orientation, e.g., at a 90 degree rotation from the first.

In certain signage embodiments, the waveguide component can comprise a window or other structural, decorative, architectural, or other structure or element fabricated from a material with waveguiding capability to which a predetermined arrangement including quantum confined semiconductor nanoparticles are applied as contemplated by this disclosure in accordance with this disclosure and into which light is coupled from a, light source, as also contemplated herein. As is particularly advantageous for certain applications, when not optically excited by the waveguided light from one or more light sources, the predetermined arrangement is not visibly emissive and is substantially transparent under ambient conditions (<0.1 Abs units).

In accordance with another aspect of the invention, there is provided a kit comprising a light source adapted for being optically coupled to a waveguide component and one or more films, wherein at least one film comprises a carrier substrate including quantum confined semiconductor nanoparticles disposed over a surface thereof, wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the quantum confined semiconductor nanoparticles are disposed in a predetermined arrangement. In certain embodiments, the film includes from about 0.001 to about 15 weight percent quantum confined semiconductor nanoparticles based on the weight of the film. In certain embodiments, one or more of the films comprises a decal. In certain embodiments, the kit further includes a waveguide component.

In certain embodiments, the geometrical shape and dimensions of a carrier substrate of the decal or other film can be selected based on the particular end-use application. In certain embodiments, the thickness of the carrier substrate is substantially uniform. In certain embodiments, the thickness of the carrier substrate can be non-uniform (e.g., tapered).

Preferably, the carrier substrate comprises a thin flexible component. In certain embodiments, the thickness of the carrier substrate is less than or equal to about 1000 microns. In certain embodiments, the thickness of the carrier substrate is less than or equal to about 500 microns. In certain embodiments, the thickness of the carrier substrate is in a range from 10 to about 200 microns.

In certain embodiments, the light source(s) are adapted for coupling light into a waveguide component. For example, one or more light sources (e.g., one or more lamps, LEDs, or other lighting devices) can by included in a structural member which is adapted for fixed or removable attachment to a surface of the waveguide component for coupling light into the waveguide component. In certain embodiments, the structural member positions the one or more light sources included therein such that such that substantially none of the light coupled into the waveguide component passes directly out of the surface of the waveguide component over which the quantum confined semiconductor nanoparticles are disposed. In such embodiments, light emitted from the surface is that absorbed and re-emitted by the nanoparticles. In certain embodiments in which the light is coupled into the surface of the waveguide component over which the nanoparticles are disposed, the angle at which the light is directed into such surface of the waveguide component is no greater than the critical angle for the member (e.g., 42 degrees for glass/air). In certain embodiments, the structural member comprises a prism with a triangular cross-section, preferably a 30-60-90 triangle, which is optically coupled to the waveguide component.

Figure 5:
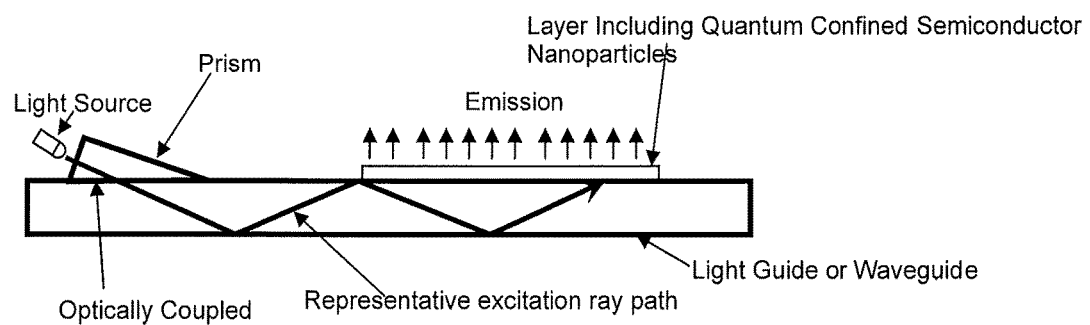
FIG. 5 is a schematic drawing depicting an example of an embodiment of the present invention.

FIG. 5 schematically depicts an example of various embodiments of the present invention. A light guide or waveguide (which can be a waveguide component or a member having waveguiding capability) includes quantum confined semiconductor nanoparticles disposed over a surface thereof. In certain embodiments, the nanoparticles can be included in a composition taught herein. In certain embodiments, the nanoparticles can be included on a film as taught herein which is attached to the light guide. In the illustrated example, a light source is positioned to couple light into the surface of the light guide over which the nanoparticles are disposed. In the depicted example, where access to the edge of the light guide may not be accessible, in order to avoid light passing directly through the light guide, a structural member comprising a prism is used as a means to position the light source at an angle not exceeding the critical angle for being coupled into the light guide.

In certain embodiments, the nanoparticles or film can be disposed on the surface of the light guide. In certain embodiments, other layers or structures can be position between them.

In certain embodiments, a kit can include other light sources, films, quantum confined semiconductor nanoparticles, waveguide components, compositions, etc. described herein.

In accordance with another aspect of the present invention, there is provided a TFEL lamp including quantum confined semiconductor nanoparticles disposed on a surface of the lamp, wherein at least a portion of the nanoparticles include one or more chemically distinct ligands attached to a surface thereof, at least one of said ligands being represented by the formula: X-Sp-Z, as described herein.

In certain preferred embodiments; such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, quantum confined semiconductor nanoparticles are disposed in a predetermined arrangement. In certain embodiments, the quantum confined semiconductor nanoparticles are included in a layer disposed over a surface of the lamp. In certain embodiments, the layer covers the entire light emitting surface of the lamp.

In certain embodiments, the quantum confined semiconductor nanoparticles included in a layer are arranged in one or more predetermined arrangements. In certain embodiments, the layer further comprises a host material in which the quantum confined semiconductor nanoparticles are distributed.

In certain embodiments, the quantum confined semiconductor nanoparticles are included in the host material in an amount in the range from about 0.001 to about 15 weight percent of the weight of the host material. Preferably the host material comprises a solid (as opposed to a liquid) material.

In certain embodiments, scatters are further included in the host material.

In certain embodiments, a TFEL lamp includes a film in accordance with the invention. In certain embodiments, the film comprises a decal that is attached to a surface of the lamp. In certain embodiments, the decal is laminated to the lamp structure. In certain embodiments, the decal is included in the lamp structure before the lamp is packaged or encapsulated. In certain embodiments, one or more filter layers are included under and/or over the quantum confined semiconductor nanoparticles. Other layers and/or features can also be included over the lamp and/or in the film. In certain embodiments, the film comprises a decal. In certain embodiments, an underlying filter is disposed between the quantum confined semiconductor nanoparticles (whether or not included in a host material) and the surface of the TFEL lamp. In certain embodiments, an underlying filter covers all or at least a predetermined region of the TFEL lamp beneath one or more features. Preferably the underlying filter is capable of passing of one or more predetermined wavelengths of light, and can absorb or optionally reflect other wavelengths In certain embodiments, an overlying filter material is disposed over the surface of one or more of the features that is opposite the TFEL lamp. Preferably the overlying filter is capable passing one or more predetermined wavelengths of light, and can absorb or optionally reflect other wavelengths.

In certain embodiments, multiple filter layers are included.

In certain embodiments, a TFEL lamp can further include one or more coupling members or structures that permit at least a portion of light emitted from the lamp to be optically coupled from the lamp into the nanoparticles. Such members or structures include, for example, and without limitation, members or structures that are attached to a surface of, the TFEL lamp, protrude from a surface of the TFEL lamp (e.g., prisms), are at least partially embedded in the surface of the lamp over which the nanoparticles are disposed. In certain embodiments, for example, coupling members or structures may be distributed across a surface of the lamp. In certain preferred embodiments, such distribution is uniform or substantially uniform. In certain embodiments, coupling members or structures may vary in shape, size, and/or frequency in order to achieve a more uniform light distribution outcoupled from the surface. In certain embodiments, coupling members or structures may be positive, i.e., sitting above the surface of the lamp, or negative, i.e., depressed into the surface of the lamp, or a combination of both. In certain embodiments, one or more features comprising a composition including a host material and quantum confined semiconductor nanoparticles can be applied to a surface of a positive coupling member or structure and/or within a negative coupling member or structure.

Figure 6:
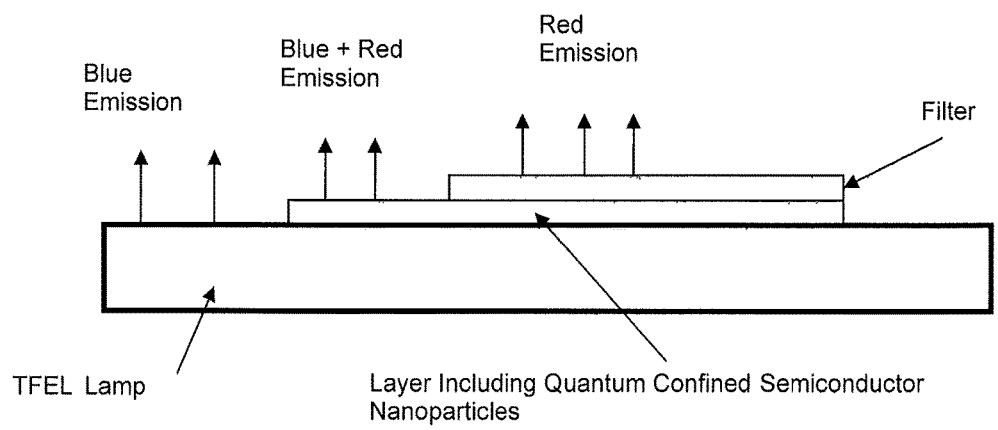
FIG. 6 is a schematic drawing depicting an example of an embodiment of a TFEL lamp in accordance with the invention.

FIG. 6 schematically depicts an example of various embodiments of a TFEL lamp in accordance with the present invention. A TFEL lamp is shown which includes quantum confined semiconductor nanoparticles disposed over a surface thereof.

In certain embodiments, the nanoparticles can be included in a composition taught herein. In certain embodiments, the nanoparticles can be included on a film as taught herein which is attached to a surface of the lamp. In the illustrated example, an overlying filter is disposed over a portion of the layer of nanoparticles. In the figure, the uncoated portion of the lamp is shown to generate blue light emission; the lamp light that passes through the portion of the nanoparticle layer that is not covered by the overlying filter includes red and blue light emission; and lamp light that passes through the portion of the nanoparticle layer that is covered by the overlying filter includes red light emission. Different color light output can be achieved with different filter selection and nanoparticle size and composition.

In accordance with still further aspects of the invention, various applications and devices that include an optical component and/or system in accordance with the invention are provided. Examples include, without limitation, user-interface illumination, solid state lighting devices, and displays. A number of examples of user-interface illumination are described in U.S. Pat. No. 6,422,712, the disclosure of which is hereby incorporated herein by reference in its entirety.

Quantum confined semiconductor nanoparticles possess characteristics and properties that make them particularly well-suited for use in a variety of devices and end-use applications, including, but not limited to, light emitting devices, solid state lighting, displays, photodetectors, other lighting components, nonvolatile memory devices, solar cells, sensors, photovoltaic devices, etc.

Certain aspects and embodiments of the inventions taught herein may be advantageous for inclusion in solid state lighting devices, including, but not limited to, those disclosed in U.S. Application Ser. No. 60/950,598, filed 18 Jul. 2007, of Peter T. Kazlas for "Quantum Dot-Based Light Sheets Useful For Solid State Lighting", which is hereby incorporated herein by reference in its entirety. Certain aspects and embodiments of the inventions taught herein may be advantageous for inclusion in photovoltaic devices, including, but not limited to, those disclosed in U.S. Application Ser. No. 60/946,382, filed 26 Jun. 2007, of Seth Coe-Sullivan et al., for "Solar Cells Including Quantum Dot Down-Conversion Materials for Photovoltaics And Materials Including Quantum Dots", which is hereby incorporated herein by reference in its entirety. Certain aspects and embodiments of the inventions taught herein may be advantageous for inclusion in other types of electronic or optoelectronic devices.

In certain embodiments, a display includes an optical component in accordance with the invention and at least one light source coupled to the optical component. Examples of a light source include, but are not limited to, an EL lamp, a TFEL lamp, an LED, a fluorescent lamp, a high pressure discharge lamp, a tungsten halogen lamp, an LED, a laser, and arrays of any of the foregoing. In certain embodiments, the optical component is back-illuminated (back-lit), front illuminated (front-lit), edge-illuminated (edge-lit), or with other configurations wherein light from a light source is directed through the optical component for creating display images or indicia.

In certain aspects and embodiments of the inventions contemplated by this disclosure, quantum confined semiconductor nanoparticles comprise semiconductor nanocrystals wherein at least a portion of the nanoparticles include one or more chemically distinct ligands attached to a surface thereof, at least one of said ligands being represented by the formula: X-Sp-Z, as described herein.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain aspects and embodiments of the inventions contemplated by this disclosure, a composition in accordance with an embodiment of the invention can further include a UV absorber, a dispersant, leveling agent, viscosity modifiers, colorants (e.g., dyes), phosphor particles, humectants, fillers, extenders, etc., and mixtures thereof.

In certain aspects and embodiments of the inventions contemplated by this disclosure, a composition in accordance with an embodiment of the invention does not include phosphor particles.

In certain preferred embodiments, a composition in accordance with the invention can be prepared, for example, from an ink comprising quantum confined semiconductor nanoparticles and a liquid vehicle, wherein at least a portion of the nanoparticles include one or more chemically distinct ligands attached to a surface thereof, at least one of said ligands being represented by the formula: X-Sp-Z, as described herein, and wherein the liquid vehicle comprises one or more functional groups that are capable of being polymerized (e.g., cross-linked) to form a host material. In certain embodiments, the functional units can be cross-linked by UV treatment.

In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the functional units can be cross-linked by thermal treatment. In certain embodiments, the functional units can be cross-linked by other cross-linking technique readily ascertainable by a person of ordinary skill in a relevant art. In certain embodiments, the composition including one or more functional groups that are capable of being cross-linked can be the liquid vehicle itself. In certain embodiments the host is solidified from the liquid vehicle by solvent removal from a resin in solution.

See also U.S. Application No. 60/946,090 of Linton, et al., for "Methods For Depositing Nanomaterial, Methods For Fabricating A Device, Methods For Fabricating An Array Of Devices And Compositions", filed 25 Jun. 2007, and U.S. Application No. 60/949,306 of Linton, et al., for "Compositions, Methods For Depositing Nanomaterial, Methods For Fabricating A Device, And Methods For Fabricating An Array Of Devices", filed 12 Jul. 2007, the disclosures of each of which are hereby incorporated herein by reference. Optionally, the ink further includes scatterers and/or other additives.

In certain embodiments, an optical component can be a top or bottom surface, or other component of a light emitting device, a display, another type of lighting device or unit, a waveguide, and the like.

In certain embodiments, a film, waveguide component, or optical component may optionally include one or more additional layers and/or elements. In one embodiment, for example, an optical component may further include one or more separate layers including scatterers. A layer including scatterers may be disposed over and/or under any layer, or other arrangement of quantum confined semiconductor nanoparticles included directly or indirectly on a film or waveguide component or in an optical component (whether or not the layer or other arrangement of quantum confined semiconductor nanoparticles further includes scatters and/or other additives or materials). In certain embodiments of a film, waveguide, or optical component including two or more stacked layers or other arrangements including quantum confined semiconductor nanoparticles, one or more layers comprising scatterers may be disposed between any or all of the layers including nanoparticles. Examples of scatters are provided elsewhere herein. In certain embodiments, layers including scatterers can be patterned or unpatterned. In various embodiments and aspects of the inventions contemplated by this disclosure, quantum confined semiconductor nanoparticles comprise semiconductor nanocrystals. Semiconductor nanocrystals possess characteristics and properties that make them particularly well-suited for use in a variety of devices and other end-use applications, including, but not limited to, light emitting devices, displays, photodetectors, nonvolatile memory devices, solar cells, sensors, photovoltaic devices, etc.

In certain aspects and embodiments of the inventions contemplated by this disclosure, reflective components such as reflective films, aluminized coatings, surface relief features, brightness enhancing films, and other components that can re-direct or reflect light can be further included. A waveguide component or film may also contain non-scattering regions such as substrates.

Examples of optical coupling methods include, but are not limited to, methods of coupling wherein the two regions coupled together have similar refractive indices or using an optical adhesive with a refractive index substantially near or in-between the regions or layers. Optical coupling can also be accomplished by an air gap between the light source and waveguide component. Other non-limiting examples of optical coupling include lamination using an index-matched optical adhesive, coating a region or layer onto another region or layer, or hot lamination using applied pressure to join two or more layers or regions that have substantially close refractive indices. Thermal transferring is another method that can be used to optically couple two regions of material.

Figure 2:
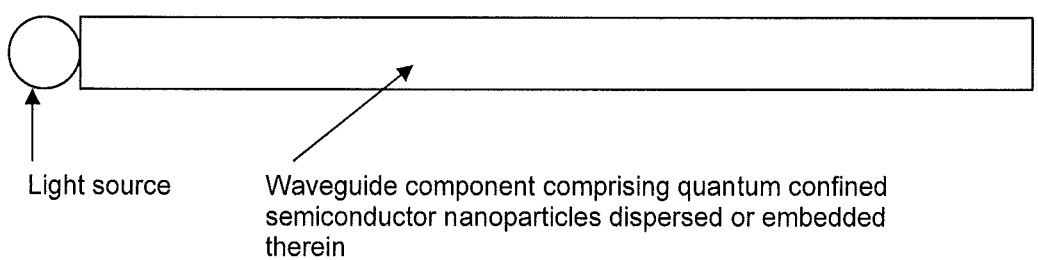
FIG. 2 is a schematic drawing depicting an example of an embodiment of a system including an example of an embodiment of an optical component in accordance with the invention.

FIG. 1 and FIG. 2 provide schematic drawings of examples of certain embodiments of a system including examples of certain embodiments of an optical component in accordance with the present invention and a light source.

In the example shown, the optical component includes a waveguide component 1 and a layer comprising semiconductor nanocrystals disposed on a major surface of the waveguide component. In certain preferred embodiments, such ligand comprises a native ligand.

In certain embodiments, a nanoparticle can include two or more chemically distinct ligands attached to a surface thereof, at least one of said ligands being represented by the formula: X-Sp-Z, as described herein.

In certain embodiments, one or both of such ligands comprise a native ligand.

In certain embodiments, at least a portion of the nanoparticles include two or more chemically distinct ligands attached to a surface thereof, wherein the ligands are represented by the formulae: Y-Sp-Z and N-Sp-Z, as described herein.

In certain embodiments, one or both of such ligands comprises a native ligand.

In certain embodiments, the layer comprising quantum confined semiconductor nanoparticles (preferably, semiconductor nanocrystals) can optionally further include a host material in which the quantum confined semiconductor nanoparticles are dispersed. Such dispersion can be uniform or non-uniform. In the depicted example, the light source is optically coupled to the waveguide component by being butted against an edge of the waveguide component. Other methods of coupling the light source to the waveguide component include embedding the light source within the waveguide component, or coupling the light source to the face of the waveguide through features, gratings, or prisms.

Quantum confined semiconductor nanocrystals are preferred for use in the various aspects and embodiments of the inventions contemplated by this disclosure.

Because the size of the semiconductor nanocrystals preferably ranges from 1.2 nm to 15 nm, coatings containing the semiconductor nanocrystals and not containing scattering particles can be substantially transparent. Coatings containing other down-converting particles such as phosphors, which have particle sizes from 1 micron to 50 microns, are hazy to opaque (depending on particle concentration).

The size and composition of quantum confined semiconductor nanoparticles (including, e.g., semiconductor nanocrystals) can be selected such that semiconductor nanocrystals emit photons at a predetermined wavelength or wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

Quantum confined semiconductor nanoparticles can be dispersed in a liquid medium and are therefore compatible with thin-film deposition techniques such as spin-casting, drop-casting, phase-separation, and dip coating. Quantum confined semiconductor nanoparticles can alternatively be deposited by ink-jet printing, silk-screening, and other liquid film techniques available for forming patterns on a surface.

An ink including quantum confined semiconductor nanoparticles described herein that are dispersed in a liquid medium can also be deposited onto a surface of a waveguide or other substrate or surface by printing, screen-printing, spin-coating, gravure techniques, inkjet printing, roll printing, etc. The ink can be deposited in a predetermined arrangement. For example, the ink can be deposited in a patterned or unpatterned arrangement. For additional information that may be useful with the present invention, see, for example, International Patent Application No. PCT/US2007/014711, entitled "Methods For Depositing Nanomaterial, Methods For Fabricating A Device, And Methods For Fabricating An Array Of Devices", of Seth A. Coe-Sullivan, filed 25 Jun. 2007, International Patent Application No. PCT/US2007/014705, entitled "Methods For Depositing Nanomaterial, Methods For Fabricating A Device, Methods For Fabricating An Array Of Devices And Compositions", of Seth A. Coe-Sullivan, et al., filed 25 Jun. 2007, International Patent Application No. PCT/US2007/014706, entitled "Methods And Articles Including Nanomaterial", of Seth A. Coe-Sullivan, et al., filed 25 Jun. 2007, International Patent Application No. PCT/US2007/08873, entitled "Composition Including Material, Methods Of Depositing Material, Articles Including Same And Systems For Depositing Material", of Seth A. Coe-Sullivan, et al., filed 9 Apr. 2007, International Patent Application No. PCT/US2007/09255, entitled "Methods Of Depositing Material, Methods Of Making A Device, And Systems And Articles For Use In Depositing Material", of Maria J, Anc, et al., filed 13 Apr. 2007, International Patent Application No. PCT/US2007/08705, entitled "Methods And Articles Including Nanomaterial", of Seth Coe-Sullivan, et al, filed 9 Apr. 2007, International Patent Application No. PCT/US2007/08721, entitled "Methods Of Depositing Nanomaterial & Methods Of Making A Device" of Marshall Cox, et al., filed 9 Apr. 2007, U.S. patent application Ser. No. 11/253,612, entitled "Method And System For Transferring A Patterned Material" of Seth Coe-Sullivan, et al., filed 20 Oct. 2005, and U.S. patent application Ser. No. 11/253,595, entitled "Light Emitting Device Including Semiconductor Nanocrystals", of Seth Coe-Sullivan, et al., filed 20 Oct. 2005, each of the foregoing patent applications being hereby incorporated herein by reference.

For additional information relating to contact printing, see, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety.

Ink-based deposition techniques can be used for depositing a various thicknesses of quantum confined semiconductor nanoparticles described herein.

In certain embodiments the thickness is selected to achieve the desired % absorption thereby. Examples of desired % absorptions can include, without limitation, from about 0.1% to about 99%, from about 10% to about 90%, from about 10% to about 50%, from about 50% to about 90%. Preferably, the quantum confined semiconductor nanoparticles absorb at least a portion of impinging light and reemit at least a portion of the absorbed light energy as one or more photons of a predetermined wavelength(s). Most preferably, the quantum confined semiconductor nanoparticles do not absorb any, or absorb only negligible amounts of, the re-emitted photons.

In certain embodiments, a composition described herein can be applied a predefined region (also referred to herein as a predetermined region) on a waveguide or other substrate. The predefined region is a region on the substrate where the composition is selectively applied. The composition and substrate can be chosen such that the material remains substantially entirely within the predetermined region. By selecting a predefined region that forms a pattern, composition can be applied to the substrate such that the material forms a pattern. The pattern can be a regular pattern (such as an array, or a series of lines), or an irregular pattern. Once a pattern of composition is formed on the substrate, the substrate can have a region including the material (the predefined region) and a region substantially free of the composition. In some circumstances, the composition forms a monolayer thickness of nanoparticles on the substrate. The predefined region can be a discontinuous region. In other words, when the composition is applied to the predefined region of the substrate, locations including the composition can be separated by other locations that are substantially free of the composition.

Due to the positioning of the quantum confined semiconductor nanoparticles in features or layers resulting from these deposition techniques, not all of the surfaces of the nanoparticles may be available to absorb and emit light.

Alternatively, in certain embodiments, the quantum confined semiconductor nanoparticles described herein can be dispersed in a light-transmissive material (e.g., a polymer, a resin, a silica glass, or a silica gel, etc., which is preferably at least partially light-transmissive, and more preferably transparent, to the light emitted by the quantum confined semiconductor nanoparticles and in which quantum confined semiconductor nanoparticles can be dispersed) that is deposited as a full or partial layer or in a patterned arrangement by any of the above-listed or other known techniques. Suitable materials include many inexpensive and commonly available materials, such as polystyrene, epoxy, polyimides, and silica glass.

In certain embodiments, such material may contain a dispersion of the quantum confined semiconductor nanoparticles described herein where the nanoparticles have been size selected so as to produce light of a given color under optical excitation. Other configurations of quantum confined semiconductor nanoparticles disposed in a material, such as, for example, a two-dimensional layer on a substrate with a polymer overcoating are also contemplated.

In certain embodiments in which quantum confined semiconductor nanoparticles are dispersed in a host material and applied as a layer on a surface of the waveguide component, the refractive index of the layer including the quantum confined semiconductor nanoparticles can have a refractive index that is greater than or equal to the refractive index of the waveguide component.

In certain embodiments in which the quantum confined semiconductor nanoparticles are dispersed in a host material and applied as a layer on a surface of the waveguide component, the refractive index of the layer including the quantum confined semiconductor nanoparticles can have a refractive index that is less than the refractive index of the waveguide component.

In certain embodiments, a reflective material can be applied to the edges of the waveguide component to enhance internal reflections of light within the waveguide component.

In certain embodiments, a reflective material can be applied to a surface of the waveguide component opposite that on which a layer including quantum confined semiconductor nanoparticles is disposed to enhance internal reflections of light within the waveguide component, as well as to reflect the emission from the semiconductor nanoparticles to the viewer.

In certain embodiments of the inventions taught herein including a layer comprising quantum confined semiconductor nanoparticles on a surface of the waveguide component, the optical component can optionally further include a cover, coating or layer over at least the portion of the surface upon which the layer comprising quantum confined semiconductor nanoparticles are disposed for protection from the environment (e.g., dust, moisture, and the like) and/or scratching or abrasion.

In certain embodiments, an optical component can further include a lens, prismatic surface, grating, etc. on the surface thereof from which light is emitted. Anti-reflection, light polarizing, and/or other coatings can also optionally be included on such surface.

In certain embodiments, a quantum confined semiconductor nanoparticle (e.g., a semiconductor nanocrystal) described herein can be formed, or overcoated in order to generate a shell on at least a portion of an outer surface of a nanoparticle, in the presence of at least one molecule having the following formula:

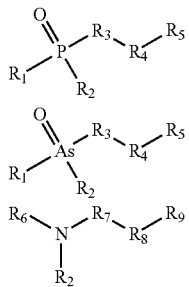

Wherein $R_1$ represents a hydroxyl group; $R_2$ represents a hydroxyl, hydrogen, an alkyl or alkylene group, an aryl or arylene group, $-OR_{11}$, $-NHR_{11}$, $-NR_{11}R_{11}$, $-SR_{11}$, wherein $R_{11}$, represents hydrogen, an alkyl group, or an aryl group; $R_3$ and $R_4$, which can be the same or different, represent a bond, an alkyl or alkylene group, an aryl or arylene group, a fluorocarbon group,

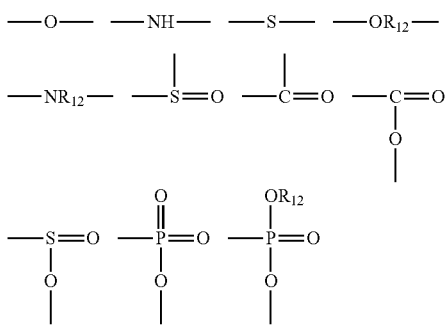

wherein $R_{12}$ is an alkyl or alkylene group or an aryl or arylene group; $R_5$ represents hydrogen, an alkyl group including one or more functional groups, an alkylene group, an aryl or arylene group, $-OR_{13}$, $-NHR_{13}$, $-NR_{13}R_{13}$, $-SR_{13}$, wherein $R_{13}$ represents hydrogen, an alkyl group, or an aryl group; $R_6$ represents hydrogen; $R_7$ represents hydrogen, an alkyl or alkylene group, an aryl or arylene group, $-OR_{14}$, $-NHR_{14}$, $-NR_{14}R_{14}$, $-SR_N$, wherein $R_{14}$ represents hydrogen, an alkyl group, or an aryl group; $R_8$ and $R_9$, which can be the same or different, represent a bond, an alkylene group, an aryl or arylene group, a fluorocarbon group,

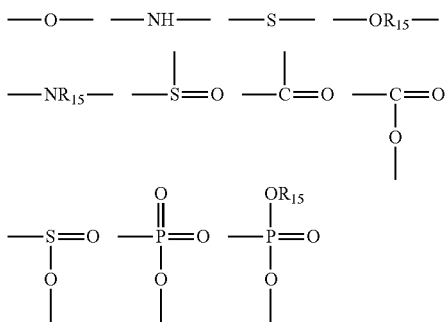

wherein $R_{15}$ is an alkyl or alkylene group or an aryl or arylene group; $R_8$ can also represent an alkyl group; $R_9$ can represent an alkyl group including one or more functional groups; $R_{10}$ represents hydrogen, an alkyl or alkylene group, an aryl or arylene group, $-OR_{16}$, $-NHR_{16}$, $-NR_{16}R_{16}$, $-SR_{16}$, wherein $R_{16}$ represents hydrogen, an alkyl group, or an aryl group.

Furthermore, certain embodiments of the ligand architecture described herein opens up the possibility for a modular synthetic scheme for tailoring a quantum dot surface with any desired characteristic. For example, a terminal hydroxyl group provides a site for additional chemical reactivity. The nucleophilic nature of the —OH group can do various addition and substitution reactions with the appropriate electrophile. For example, quantum dots (e.g., semiconductor nanocrystals) with this nucleophilic surface group can be reacted with an electrophile, such as an acid chloride, isocyanate, or carboxylic acid group resulting in the following ester and urethane linkages:

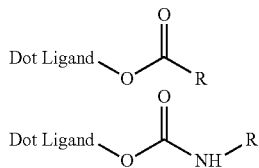

Where R can be any substituent. The —OH group can also be substituted for a primary amine resulting in the following amide and urea linkages with the electrophiles mentioned herein:

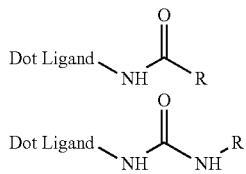

Where, again, R can be any substituent.

Examples of chemical structures for use in functionalizing a surface of a semiconductor nanocrystal with terminal hydroxyl groups include, but are not limited to:

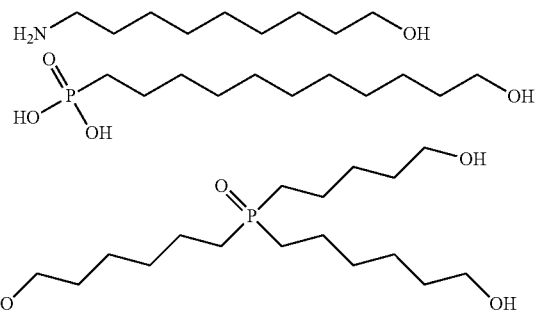

This approach may be achieved in the presence of phosphine oxide (TOPO) with the addition of high boiling polar a-protic solvents (e.g. 1,3-Dimethyl-2-imidazolidone (DMI), Carbitol Acetate, N,N-Dimethylacrylamide (DMAc), 1-Methyl-2-pyrrolidnone (NMP), etc.).

Examples of coupling species for use with hydroxy-terminated semiconductor nanocrystals include, but are not limited to:

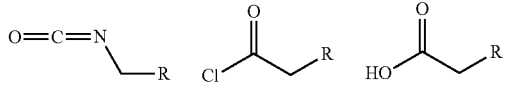

The functional groups are isocyanates, acid chlorides, and carboxylic acids from left to right. Where R can be, and is most certainly not limited to, any of the following chemical species (with any length aliphatic chain linker connecting the molecule to the functional group shown herein).

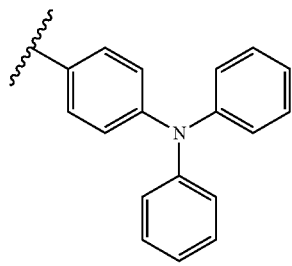

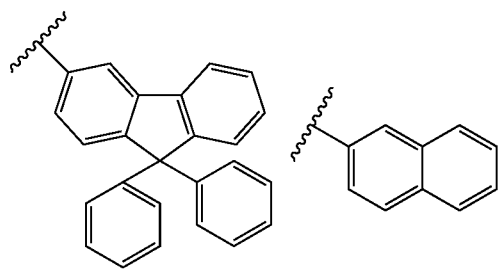

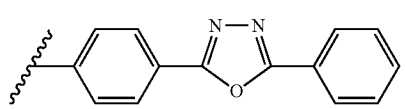

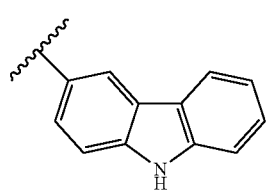

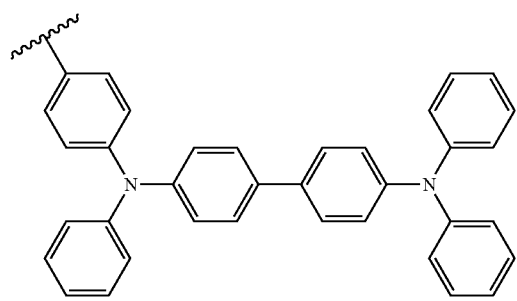

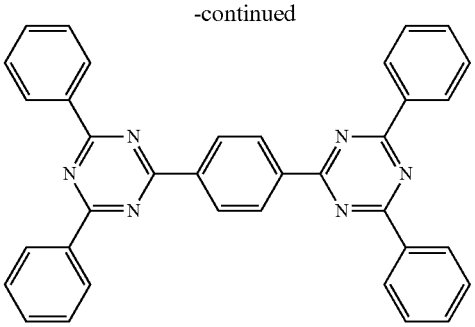

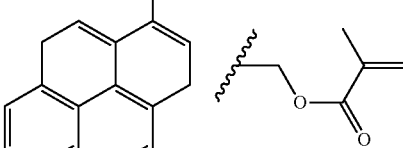

The system described herein can be further augmented by building similar variability into the phosphine oxide derivative used as the solvent in the overcoating procedure. For example, this species has the formula:

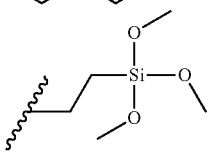

Wherein $R_{17}$, $R_{18}$, and $R_{19}$, which can be the same or different, represent a bond, an alkyl or alkylene group, an aryl or arylene group, a fluorocarbon group,

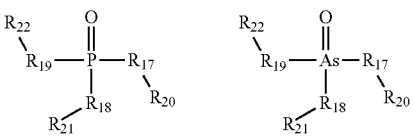

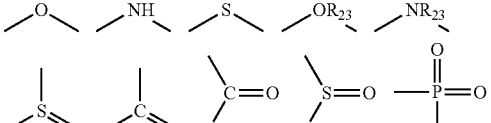

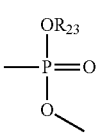

wherein $R_{23}$ is an alkyl or alkylene group or an aryl or arylene group; $R_{20}$, $R_{21}$, and $R_{22}$, which can be the same or different, represent hydrogen, an alkyl or alkylene group, an aryl or arylene group, $-OR_{24}$, $-NHR_{24}$, $-NR_{24}R_{24}$, $-SR_{24}$, wherein $R_{24}$ represents hydrogen, an alkyl group, or an aryl group.

To avoid the introduction of impurities which may have an unpredictable effect on the reaction, the ligands should preferably have a purity of at least 99 wt. %, and preferably greater than 99.5%.

Phosphinic or arsinic acid groups useful in the practice of the invention may include mono- and di-phosphinic/arsinic acid groups.

In certain embodiments, a quantum confined semiconductor nanoparticle described herein (e.g., a semiconductor nanocrystal) can be formed, or overcoated in order to generate a shell on at least a portion of an outer surface of a nanoparticle, in the presence of molecules represented by one of the following formula or in the presence of molecules of both of the following formula:

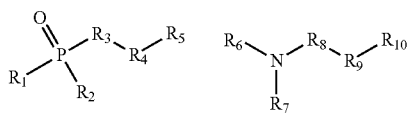

(in the above formula on the left, P can alternatively be As)

wherein $R_1$ represents a hydroxyl group; $R_2$ represents hydrogen, an alkyl or alkylene group, an aryl or arylene group, $-OR_{11}$, $-NHR_{11}$, $-NR_{11}R_{11}$, $-SR_{11}$, wherein $R_{11}$ represents hydrogen, an alkyl group, or an aryl group; $R_3$ and $R_4$, which can be the same or different, represent a bond, an alkyl or alkylene group, an aryl or arylene group, a fluorocarbon group,

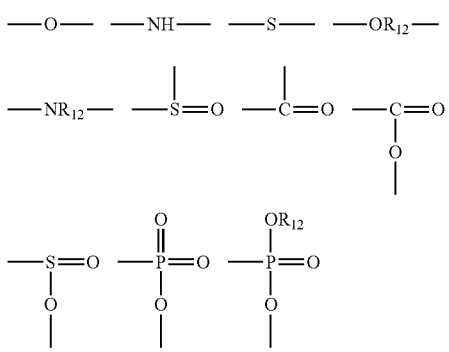

wherein $R_{12}$ is an alkyl or alkylene group or an aryl or arylene group; $R_5$ represents hydrogen, an alkyl group including one or more functional groups, an alkylene group, an aryl or arylene group, $-OR_{13}$, $-NHR_{13}$, $-NR_{13}R_{13}$, $-SR_{13}$, wherein $R_{13}$ represents hydrogen, an alkyl group, or an aryl group; $R_6$ represents hydrogen; $R_7$ represents hydrogen, an alkyl or alkylene group, an aryl or arylene group, $-OR_{14}$, $-NHR_{14}$, $-NR_{14}R_{14}$, $-SR_{14}$, wherein $R_{14}$ represents hydrogen, an alkyl group, or an aryl group; $R_8$ and $R_9$, which can be the same or different, represent a bond, an alkyl or alkylene group, an myl or arylene group, a fluorocarbon group,

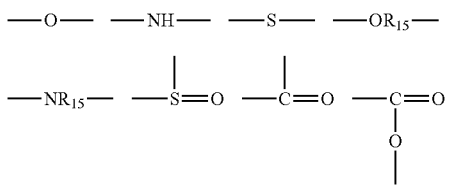

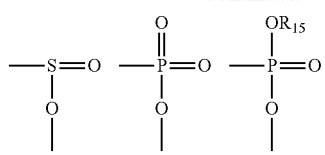

wherein $R_{15}$ is an alkyl or alkylene group or an aryl or arylene group; $R_{10}$ represents hydrogen, an alkyl group including one or more functional groups, an alkylene group, an aryl or arylene group, $-OR_{16}$, $-NHR_{16}$, $-NR_{16}R_{16}$, $-SR_{16}$, wherein $R_{16}$ represents hydrogen, an alkyl group, or an aryl group.

In certain embodiments, a ligand system can be further augmented by building similar variability into the phosphine oxide derivative used as the solvent in the overcoating procedure. In certain embodiments, for example, a phosphine oxide species can have the formula:

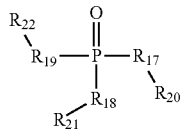

Wherein $R_{17}$, $R_{18}$, and $R_{19}$, which can be the same or different, represent a bond, an alkyl or alkylene group, an aryl or arylene group, a fluorocarbon group,

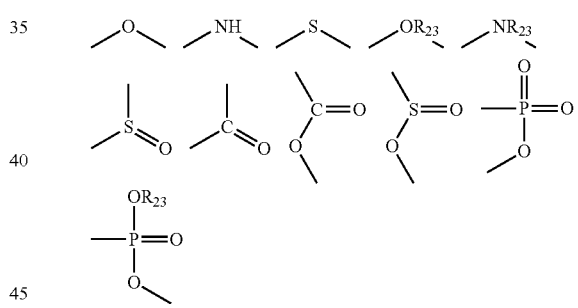

wherein $R_{23}$ is an alkyl or alkylene group or an aryl or arylene group; $R_{20}$, $R_{21}$, and $R_{22}$, which can be the same or different, represent hydrogen, an alkyl or alkylene group, an aryl or arylene group, $-OR_{24}$, $-NHR_{24}$, $-NR_{24}R_{24}$, $-SR_{24}$, wherein $R_{24}$ represents hydrogen, an alkyl group, or an aryl group.

To avoid the introduction of impurities which may have an unpredictable effect on the reaction, the ligands should preferably have a purity of at least 99 wt. %, and preferably greater than 99.5%.

Phosphinic acid groups useful in the practice of the invention may include mono and diphosphinic acid groups.

As described herein, arsenic variations of the above-described phosphorus-containing acid and oxide groups can also be used.

The present invention will be further clarified by the following examples, which are intended to be exemplary of the present invention.

EXAMPLE 1

Preparation of Semiconductor Nanocrystals Capable of Emitting Green Light

Synthesis of ZnSe Cores: 0.69 mmol diethyl zinc was dissolved in 5 mL of tri-n-octylphosphine and mixed with 1 mL of 1 M TBP-Se, 28.9 mmol of Oleylamine was loaded into a 3-neck flask, dried and degassed at 90° C. for one hour. After degassing, the flask was heated to 310° C. under nitrogen. Once the temperature reached 310° C., the Zn solution was injected and the reaction mixture was heated at 270° C. for 15-30 minutes while aliquots of the solution were removed periodically in order to monitor the growth of the nanocrystals. Once the first absorption peak of the nanocrystals reached 350 nm, the reaction was stopped by dropping the flask temperature to 160° C. and used without further purification for preparation of CdZnSe cores.

Synthesis of CdZnSe Cores: 1.12 mmol dimethylcadmium was dissolved in 5 mL of tri-n-octylphosphine and mixed with 1 mL of 1 M TBP-Se. In a 4-neck flask, 41.38 mmol of trioctylphosphine oxide and 4 mmol of hexylphosphonic acid were loaded, dried and degassed at 120° C. for one hour. After degassing, the oxide/acid was heated to 160° C. under nitrogen and 8 ml of the ZnSe core growth solution was transferred at 160° C. into the flask, immediately followed by the addition of Cd/Se solution over the course of 20 minutes via syringe pump. The reaction mixture was then heated at 150° C. for 16-20 hours while aliquots of the solution were removed periodically in order to monitor the growth of the nanocrystals. Once the emission peak of the nanocrystals reached 500 nm, the reaction was stopped by cooling the mixture to room temperature. The CdZnSe cores were precipitated out of the growth solution inside a nitrogen atmosphere glove box by adding a 2:1 mixture of methanol and n-butanol. The isolated cores were then dissolved in hexane and used to make core-shell materials.

Synthesis of CdZnSe/CdZnS Core-Shell Nanocrystals: 25.86 mmol of trioctylphosphine oxide and 2.4 mmol of benzylphosphonic acid were loaded into a four-neck flask. The mixture was then dried and degassed in the reaction vessel by heating to 120° C. for about an hour. The flask was then cooled to 75° C. and the hexane solution containing isolated CdZnSe cores (0.1 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn and S samples were each dissolved in 4 mL of trioctylphosphine inside a nitrogen atmosphere glove box. Once the precursor solutions were prepared, the reaction flask was heated to 150° C. under nitrogen. The precursor solutions were added dropwise over the course of 2 hours at 150° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and used to make compositions including quantum confined semiconductor nanoparticles and a host material.

EXAMPLE 2

Preparation of Semiconductor Nanocrystals Capable of Emitting Red Light

Synthesis of CdSe Cores: 1 mmol cadmium acetate was dissolved in 8.96 mmol of tri-n-octylphosphine at 100° C. in a 20 mL vial and then dried and degassed for one hour. 15.5 mmol of trioctylphosphine oxide and 2 mmol of octadecylphosphonic acid were added to a 3-neck flask and dried and degassed at 140° C. for one hour. After degassing, the Cd solution was added to the oxide/acid flask and the mixture was heated to 270° C. under nitrogen. Once the temperature reached 270° C., 8 mmol of tri-n-butylphosphine was injected into the flask. The temperature was brought back to 270° C. where 1.1 mL of 1.5 M TBP-Se was then rapidly injected. The reaction mixture was heated at 270° C. for 15-30 minutes while aliquots of the solution were removed periodically in order to monitor the growth of the nanocrystals. Once the first absorption peak of the nanocrystals reached 565-575 nm, the reaction was stopped by cooling the mixture to room temperature. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of CdSe/CdZnS Core-Shell Nanocrystals; 25.86 mmol of trioctylphosphine oxide and 2.4 mmol of octadecylphosphonic acid were loaded into a four-neck flask. The mixture was then dried and degassed in the reaction vessel by heating to 120° C. for about an hour. The flask was then cooled to 75° C. and the hexane solution containing isolated CdSe cores (0.1 mmol Cd content) was added to the reaction mixture. The hexane was removed under reduced pressure and then 2.4 mmol of 6-amino-1-hexanol was added to the reaction mixture. Dimethylcadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn and S samples were each dissolved in 4 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and used to make compositions including quantum confined semiconductor nanoparticles and a host material.

Preparation of Layer Including Semiconductor Nanocrystals

Samples including semiconductor nanocrystals prepared substantially in accordance with one of the above-described examples are received in hexane. (A sample typically represents approximately 40 mg of solid dispersed in 10-15 ml hexane.) The hexane is removed from the dots under vacuum at room temperature. Care is taken not to overdry or completely remove all solvent. 0.5 ml of a low viscosity reactive diluent RD-12, commercially available from Radcure Corp, 9 Audrey Pl, Fairfield, N.J. 07004-3401, United States, is added to the semiconductor nanocrystals while stirring magnetically. After the semiconductor nanocrystals are pre-solubilized in the reactive diluent, 2 ml of a UV-curable acrylic formulation DR-150, commercially available from Radcure Corp.) is added dropwise while stirring vigorously. Occasionally, the mixing vial is heated to lower viscosity and aid stirring. After the addition is competed, vacuum is pulled to remove entrained air and residual solvent. The vial is then placed in an ultrasonic bath (VWR)

from 1 hour to overnight, resulting in a clear, colored solution. Care is taken to avoid temperatures over 40 C while the sample is in the ultrasonic bath.

Multiple batches of the semiconductor nanocrystals of the same color in UV curable acrylic are mixed together. For the samples below (Table 2), the three red batches listed in Table 1 were added together; and four green batches listed in Table 1 were added together.

Samples are coated by Mayer rod on precleaned glass slides and cured in a 5000-EC UV Light Curing Flood Lamp from DYMAX Corporation system with an H-bulb (225 mW/cm$^2$) for 10 seconds.

Samples including multiple layers for achieving the desired thickness are cured between layers. Samples including filters on top of (or below) the layers including host material and quantum confined semiconductor nanoparticles have the filters coated by Mayer rod in a separate step. Filters are made by blending UV-curable pigment ink formulations from Coates/Sun Chemical. (Examples include, but are not limited to, DXT-1935 and WIN99.) A filter composition is formulated by adding the weighted absorbances of the individual colors together to achieve the desired transmission characteristics.

TABLE 1

| Color/Batch # | Solvent | Ligand(s) | Emission (nm) | FWHM | Solution QY (%) |
|---|---|---|---|---|---|
| Red/Batch #1 (Nanocrystals prepared generally in accordance with procedures described in EXAMPLE 2 above) | Hexane | ODPA with 6-amino-1-hexanol | 617 | 40 | 73 |
| Red/Batch # 2 (Nanocrystals prepared generally in accordance with procedures described in EXAMPLE 2 above) | Hexane | ODPA with 6-amino-1-hexanol | 622 | 44 | 82 |
| Red/Batch #3 (Nanocrystals prepared generally in accordance with procedures described in EXAMPLE 2 above) | Hexane | ODPA with 6-amino-1-hexanol | 624 | 44 | 73 |
| Green/Batch #1 (Nanocrystals prepared generally in accordance with procedures described in EXAMPLE 1 above) | Hexane | Aromatic | 525 | 34 | 68 |
| Green/Batch #2 (Nanocrystals prepared generally in accordance with procedures described in EXAMPLE 1 above) | Hexane | Aromatic | 527 | 34 | 66 |
| Green/Batch #3 (Nanocrystals prepared generally in accordance with procedures described in EXAMPLE 1 above) | Hexane | Aromatic | 528 | 36 | 64 |
| Green/Batch #4 (Nanocrystals prepared generally in accordance with procedures described in EXAMPLE 1 above) | Hexane | Aromatic | 530 | 33 | 60 |
| Green/Batch #5 (Nanocrystals prepared generally in accordance with procedures described in EXAMPLE 1 above) | Hexane | Aromatic | 529 | 33 | 68 |

The films were characterized in the following ways:

Thickness: measured by a micrometer.

Emission measurement measured on sample 1 of each type, on Cary Eclipse.

Excitation at 450 nm, 2.5 nm excitation slit, 5 nm emission slit.

Absorption measured at 450 nm on sample 1 of each type, on Cary 5000. Baseline corrected to blank glass slide.

CIE coordinates measured on sample 1 of each type using CS-200 Chroma Meter. Samples were excited with 450 nm LED, and camera collected color data off axis.

Figure 4:
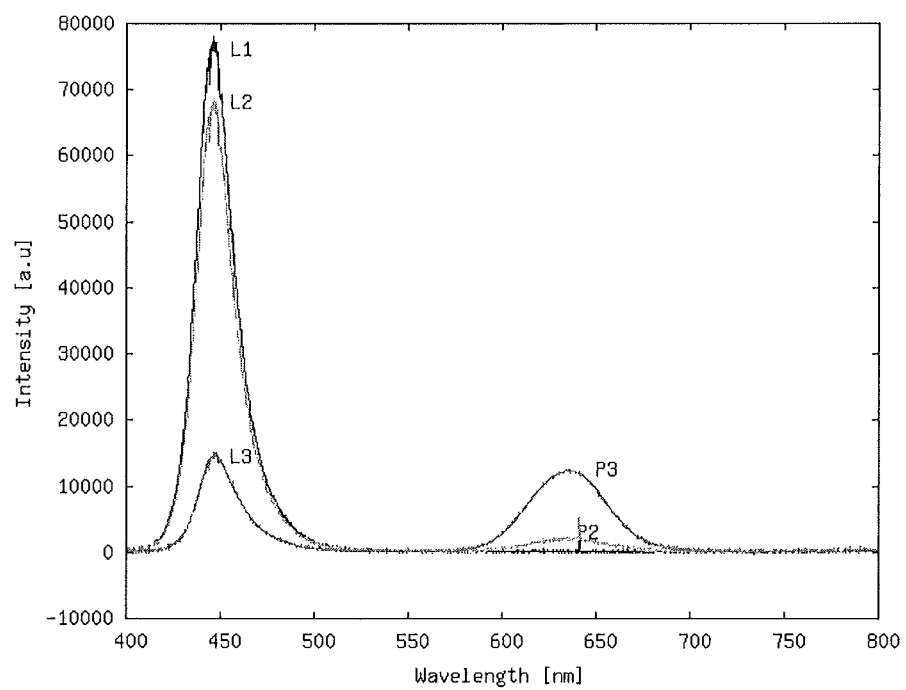
FIG. 4 depicts spectra to illustrate a method for measuring quantum efficiency.

The external photoluminescent (PL) quantum efficiency is measured using the method developed by Mello et al., Advanced Materials 9(3):230 (1997), which is hereby incorporated by reference. The method uses a collimated 450 nm LED source, an integrating sphere and a spectrometer. Three measurements are taken. First, the LED directly illuminates the integrating sphere giving a spectrum labeled L1 and shown in FIG. 4 (which graphically represents emission intensity (a.u.) as a function of wavelength (nm)) for purposes of example in describing this method. Next, the PL sample is placed into the integrating sphere so that only diffuse LED light illuminates the sample giving the (L2+P2) spectrum shown for purposes of example in FIG. 4. Finally, the PL sample is placed into the integrating sphere so that the LED directly illuminates the sample (just off normal incidence) giving the (L3+P3) spectrum shown for purposes of Example 2. After collecting the data, each spectral contribution (L's and P's) is computed. L1, L2 and L3 correspond to the sums of the LED spectra for each measurement and P2 and P3 are the sums associated with the PL spectra for 2nd and 3rd measurements. The following equation then gives the external PL quantum efficiency:

$$EQE=[(P3 \cdot L2) \text{minus} (P2 \cdot L3)]/(L1 \cdot (L2 \text{ minus } L3))$$

TABLE 2

Data For Films Prepared As Described Above Including Semiconductor Nanocrystals of the Examples

| Sample No. | Ligands | Filter | No. of Layers | Film Thickness (mm) | Emission (nm) | FWHM | CIE x y | Absorption (%) @ 450 nm | Film EQE |
|---|---|---|---|---|---|---|---|---|---|
| Red #A1 | ODPA with 6-amino-1-hexanol | None | 1 #28 rod | ~40 | 625 | 42 | 0.5712 0.2646 | 44 | 36.57 |
| Red #B1 | ODPA with 6-amino-1-hexanol | None | 1 layer (#52 rod) | ~80 | 625 | 42 | 0.6317 0.2965 (Red B1) | 65(Red B1) | 39.23 |
| Red #C1 | ODPA with 6-amino-1-hexanol | None | 2 layers: 1 layer (#52 rod) + 1 layer (#28 rod) | ~130 | 625 | 42 | 0.6549 0.3058 (Red C1) | 84(Red C1) | 30.27 |
| Red #CF1 | ODPA with 6-amino-1-hexanol | DXT-1935:WIN99 (5 parts:1 part), 1 layer (23 micron) | 2 layers: 1 layer (#52 rod) + 1 layer (#28 rod) | ~155 | 625 | 42 | 0.6701 0.3110 (Red CF1) | 99.6(Red CF1) | Not applicable when filter included |
| Green #A1 | Aromatic | None | 1 layer (#22 rod) | ~40 | 530 | 31 | 0.1917 0.6663 (Green A1) | 53(Green A1) | 32.78 |
| Green #B1 | Aromatic | None | 1 layer (#52 rod) | ~75 | 530 | 31 | 0.2017 0.6882 (Green B1) | 77(Green B1) | 36.1 |
| Green #C1 | Aromatic | None | 2 layers: 1 layer (#52 rod) + 1 layer (#22 rod) | ~120 | 530 | 31 | 0.2137 0.7237 (Green C1) | 91(Green C1) | 25.39 |
| Green #CF1 | Aromatic | DXT-1935:WIN99 (5 parts:1 part), 1 layer (23 micron) | 2 layers: 1 layer (#52 rod) + 1 layer (#22 rod) | ~140 | 530 | 31 | 0.2342 0.7036 (Green CF1) | 99.5(Green CF1) | Not applicable when filter included |

EXAMPLE 3

Preparation of Semiconductor Nanocrystals Capable of Emitting Red Light with 3,5-di-tert-butyl-4-hydroxybenzylphosphonic acid Synthesis of CdSe Cores: 1 mmol cadmium acetate was dissolved in 8.96 mmol of tri-n-octylphosphine at 100° C. in a 20 mL vial and then dried and degassed for one hour. 15.5 mmol of trioctylphosphine oxide and 2 mmol of octadecylphosphonic acid were added to a 3-neck flask and dried and degassed at 140° C. for one hour. After degassing, the Cd solution was added to the oxide/acid flask and the mixture was heated to 270° C. under nitrogen. Once the temperature reached 270° C., 8 mmol of tri-n-butylphosphine was injected into the flask. The temperature was brought back to 270° C. where 1.1 mL of 1.5 M TBP-Se was then rapidly injected. The reaction mixture was heated at 270° C. for 15-30 minutes while aliquots of the solution were removed periodically in order to monitor the growth of the nanocrystals. Once the first absorption peak of the nanocrystals reached 565-575 nm, the reaction was stopped by cooling the mixture to room temperature. The CdSe cores were precipitated out of the growth solution inside a nitrogen atmosphere glovebox by adding a 3:1 mixture of methanol and isopropanol. The isolated cores were then dissolved in hexane and used to make core-shell materials.

Preparation of 3,5-Di-tert-butyl-4-hydroxybenzylphosphonic acid 3,5-Di-tert-butyl-4-hydroxybenzylphosphonic acid was obtained from PCI Synthesis, 9 Opportunity Way, Newburyport, Mass. 01950.

The preparation of 3,5-Di-tert-butyl-4-hydroxybenzyl-phosphonic acid utilized the following synthetic approach:

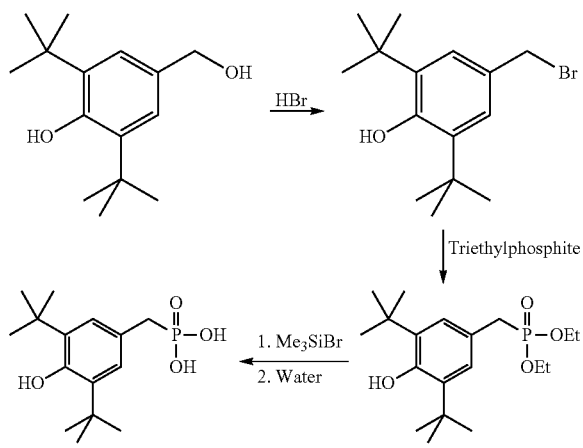

3,5-Di-tert-butyl-4-hydroxybenzylphosphonic acid can be characterized by the following:

Melting point: 199-200° C. [Lit: 200° C.; Literature ref: J. D. Spivack, FR1555941 (1969)]

IR: 3614 cm$^{-1}$, 3593 cm$^{-1}$ (weak, O—H stretching).

$^1$H-NMR (CD$_3$OD): δ 7.10 (d, aromatic, 2H, $J_{P-H}$=2.6 Hz), 5.01 (s, exchanged HOD), 2.99 (d, —CH$_2$, 2H, $J_{P-H}$=21.2 Hz), 1.41 (s, —CH$_3$, 18H).

$^{13}$C-NMR (CD$_3$OD): δ 152.9 (aromatic), 137.9 (aromatic), 126.2 (aromatic), 123.5 (aromatic), 34.41 (d, —CH$_2$, 35.75, 33.07, $J_{P-C}$=537.2 Hz), 34.35 (—C(CH$_3$)$_3$), 29.7 (—C(CH$_3$)$_3$).

$^{31}$P-NMR (CD$_3$OD): δ 26.8

The above-identified synthetic precursors included in the preparation of 3,5-Di-tert-butyl-4-hydroxybenzylphosphonic acid can be characterized by the following:

Diethyl 3,5-di-tert-butyl-4-hydroxybenzylphosphonate

Melting point: 119-120° C. (Lit: 118-119° C.; Literature ref: R. K. Ismagilov, Zhur. Obshchei Khimii, 1991, 61, 387).

IR: 3451 cm$^{-1}$ (weak, —OH, stretching), 2953 (weak, —CH$_3$, C—H stretching).

$^1$H-NMR (CDCl$_3$): δ 7.066 (d, Ar—H, 2H, $J_{P-H}$=2.8 Hz), 5.145 (s, 1H, —OH), 4.06-3.92 (m, —CH$_2$CH$_3$, 4H, H—H and long-range P—H couplings), 3.057 (d, Ar—CH$_2$, 2H, $J_{P-H}$=21.0 Hz), 1.412 (s, —C(CH$_3$)$_3$, 18H), 1.222 (t, —CH$_2$CH$_3$, 6H).

$^{13}$C-NMR (CDCl$_3$): δ 153.98 (aromatic), 136.22 (aromatic), 126.61 (aromatic), 122.07 (aromatic), 62.14 (—O CH$_2$CH$_3$, $J_{P-C}$=24.4 Hz), 33.63 (Ar—CH$_2$, $J_{P-C}$=552.4 Hz), 34.53 [—C(CH$_3$)$_3$], 30.54 [—C(CH$_3$)$_3$], 16.66 (—CH$_2$CH$_3$, $J_{P-C}$=24.4 Hz).

$^{31}$P-NMR (CDCl$_3$): δ 28.43.

3,5-di-tert-butyl-4-hydroxybenzyl bromide

Melting point: 51-54° C. (Lit: 52-54° C.; Literature ref: J. D. McClure, J. Org. Chem., 1962, 27, 2365)

IR: 3616 cm$^{-1}$ (medium, 0-H stretching), 2954 cm$^{-1}$ (weak, alkyl C—H stretching).

$^1$H-NMR (CDCl$_3$): δ 7.20 (s, Ar—H, 2H), 5.31 (s, —OH), 4.51 (s, —CH$_2$, 2H), 1.44 {s, [—C(CH$_3$)$_3$], 18H}.

$^{13}$C-NMR (CDCl$_3$): δ 154.3 (aromatic), 136.5 (aromatic), 128.7 (aromatic), 126.3 (aromatic), 35.8 [(—C(CH$_3$)$_3$], 34.6 (—CH$_2$), 30.5 [—C(CH$_3$)$_3$].

Other synthetic approaches that are known or readily ascertainable by one of ordinary skill in the relevant art can be used to prepare 3,5-Di-tert-butyl-4-hydroxybenzylphosphonic acid.

Synthesis of CdSe/CdZnS Core-Shell Nanocrystals: 25.86 mmol of trioctylphosphine oxide and 2.4 mmol of 3,5-di-tert-butyl-4-hydroxybenzylphosphonic acid were loaded into a four-neck flask. The mixture was then dried and degassed in the reaction vessel by heating to 120° C. for about an hour. The flask was then cooled to 75° C. and the hexane solution containing isolated CdSe cores (0.1 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn and S samples were each dissolved in 4 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in chloroform and used to make semiconductor nanocrystal composite materials.

In Table 3, the 3,5-di-tert-butyl-4-hydroxybenzylphosphonic acid ligand group is referred to as BHT.

Preparation of Layer Including Semiconductor Nanocrystals

Films listed in Table 3 below are prepared using samples including semiconductor nanocrystals prepared substantially in accordance with the synthesis described in Example 3. Bulk chloroform is removed from the nanocrystal samples with nitrogen purging. Residual chloroform is removed from the semiconductor nanocrystals under vacuum at room temperature. Care is taken not to overdry or completely remove all solvent.

37 ml of RD-12, a low viscosity reactive diluent commercially available from Radcure Corp, 9 Audrey Pl, Fairfield, N.J. 07004-3401, United States, is added to 4.68 gram of semiconductor nanocrystals under vacuum. The vessel is then backfilled with nitrogen and the mixture is mixed using a vortex mixer. After the semiconductor nanocrystals are pre-solubilized in the reactive diluent, 156 ml of DR-150, an UV-curable acrylic formulation commercially available Radcure, is added slowly under vacuum. The vessel is then backfilled with nitrogen and the mixture is mixed using a vortex mixer.

2.00 gram TiO2 (if indicated) is next added and the mixture is mixed with an homogenizer.

12.00 gram curing agent Escacure TPO is added, following which the mixture is mixed with an homogenizer. The vessel including the mixture is then wrappered with black tape to shield the fluid from light.

The vessel in then backfilled with nitrogen and sonified for at least about 3 hours. Care is taken to avoid temperatures over 40 C while the sample is in the ultrasonic bath.

Samples are coated by Mayer rod on precleaned glass slides and cured in a 5000-EC UV Light Curing Flood Lamp from DYMAX Corporation system with an H-bulb (225 mW/cm$^2$) for 10 seconds.

A sample is removed for evaluation and coated on a glass slide with a 52 rod and cured for 10 sec:
Thickness=72 μm
Lambda em=633.1 nm FWHM=36 nm
% EQE=50.0% % $A_{450\ nm}$=82.6%

Occasionally, the mixing vial is heated to lower viscosity and aid stirring. After the addition is competed, vacuum is pulled to remove entrained air. The vial is then placed in an ultrasonic bath (VWR) from 1 hour to overnight, resulting in a clear, colored solution. Care is taken to avoid temperatures over 40 C while the sample is in the ultrasonic bath.

Multiple batches of the semiconductor nanocrystals of the same color are mixed together. Prior to making the acrylic preparation. Samples are coated by Mayer rod on precleaned glass slides and cured in a 5000-EC UV Light Curing Flood Lamp from DYMAX Corporation system with an H-bulb (225 mW/cm$^2$) for 10 seconds.

Samples including multiple layers for achieving the desired thickness are cured between layers. Samples including filters on top of (or below) the layers including host material and quantum confined semiconductor nanoparticles have the filters coated by Mayer rod in a separate step.

Filters are made by blending UV-curable pigment ink formulations from Coates/Sun Chemical. (Examples include, but are not limited to, DXT-1935 and WIN99.) A filter composition is formulated by adding the weighted absorbances of the individual colors together to achieve the desired transmission characteristics.

TABLE 3

| Film Color/Sample # (Nanocrystal Prep. Example #) | Solvent | Ligand(s) | Emission (nm) | FWHM | Film EQE (%) |
|---|---|---|---|---|---|
| Red/Sample #1 (without TiO2) (Ex. 3) | Chloroform | BHT | 631 | 36 | 29.0 |
| Red/Sample # 2 (with TiO2) (Ex. 3) | Chloroform | BHT | 633 | 36 | 50.0 |

EXAMPLE 4

4A. Preparation of Semiconductor Nanocrystals Capable of Emitting 611 nm Light with 3,5-di-tert-butyl-4-hydroxybenzylphosphonic acid Synthesis of CdSe Cores: 29.9 mmol cadmium acetate is dissolved in 436.7 mmol of tri-n-octylphosphine at 100° C. in a 250 mL 3-neck round-bottom flask and then dried and degassed for one hour. 465.5 mmol of trioctylphosphine oxide and 61.0 mmol of octadecylphosphonic acid are added to a 0.5 L glass reactor and dried and degassed at 140° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 34 mL of 1.5 M TBP-Se is then rapidly injected. The reaction mixture is heated at 250° C. for 9 minutes at which point the heating mantle is removed from the reaction flask and the solution is allowed to cool to ambient temperature. Once the first absorption peak of the nanocrystals reaches about 558 nm, the reaction is stopped by cooling the mixture to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals: Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores (0.096 mmol Cd content) are added to each reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.29 mmol of dimethylcadmium and diethylzinc) and S (1.15 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are, then dispersed in toluene.

4B. Preparation of Optical Component Including Semiconductor Nanocrystals

The following film is prepared using optical material including semiconductor nanocrystals (prepared substantially in accordance with the synthesis described in Example 4A).

The semiconductor nanocrystals comprise red-emitting semiconductor nanocrystals dispersed in toluene and have a peak emission at 611 nm, a FWHM of about 32 nm, a solution quantum yield of 70% and a concentration of 20.4 mg/ml.

5.5 ml of the 20.4 mg/ml suspension of the red-emitting nanocrystals is added from a 6 mL syringe to a 20 ml septum capped vial including a magnetic stirrer bar, the system is closed and purged through a syringe needle under vacuum then backfilled with nitrogen. Approximately half of the solvent is removed from the vial by vacuum stripping. 1.0 ml of RD-12, a low viscosity reactive diluent commercially available from Radcure Corp, 9 Audrey Pl, Fairfield, N.J. 07004-3401 is added. 4.0 ml of DR-150 is then added to the vial through a syringe and the mixture is mixed using a Vortex mixer. (DR-150 is a UV-curable acrylic formulation commercially available from Radcure.)

0.3 ml of a 10% solution of Tego 2500 in toluene is added to the mixture by syringe while mixing. Remaining solvent is removed from the vial by vacuum stripping.

The vessel is then backfilled with nitrogen and the mixture is mixed using a Vortex mixer.

0.056 gram TiO$_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a coating.

Sample material from the vial is screen-printed onto a corona treated precleaned (using an isopropanol wipe) 1.4 mm thick polycarbonate (1% transmission haze) hexagonal cover plate and cured in a 5000-EC UV Light Curing Flood Lamp from DYMAX Corporation system with an H-bulb (225 mW/cm$^2$) for 20 seconds. The thickness of the nanocrystal containing layer on the polycarbonate is approximately 32 microns.

The resulting cover plate is included as the face plate of a white light emitting Array PAR 30 LED lamp available from NEXXUS Lighting.

EXAMPLE 5

5A. Preparation of Semiconductor Nanocrystals Capable of Emitting 588 nm Light with 3,5-di-tert-butyl-4-hydroxybenzylphosphonic acid Synthesis of CdSe Cores: 1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 M TBP-Se is then rapidly injected. The reaction mixture is heated at 270° C. for 30 seconds and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=518/529/26.5).

Synthesis of CdSe/CdZnS Core-Shell Nanocrystals: Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.062 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (0.31 mmol of dimethylcadmium and diethylzinc) and S (1.24 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined 5B. Preparation of Semiconductor Nanocrystals Capable of Emitting 632 nm Light with 3,5-di-tert-butyl-4-hydroxybenzylphosphonic acid Synthesis of CdSe Cores: 29.9 mmol cadmium acetate is dissolved in 436.7 mmol of tri-n-octylphosphine at 140° C. in a 250 mL 3-neck round-bottom schlenk flask and then dried and degassed for one hour. 465.5 mmol of trioctylphosphine oxide and 61.0 mmol of octadecylphosphonic acid are added to a 0.5 L glass reactor and dried and degassed at 120° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 33.3 mL of 1.5 M TBP-Se is then rapidly injected. The reaction mixture is heated at 270° C. for ~9 minutes at which point the heating mantle is removed from the reaction flask and the mixture is allowed to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=571/592/45)

Synthesis of CdSe/CdZnS Core-Shell Nanocrystals: Three identical reactions are conducted whereby 517.3 mmol of trioctylphosphine oxide and 48.3 mmol of 3,5-di-tert-butyl-4-hydroxybenzylphosphonic acid are loaded into a 0.5 L glass reactor. The mixtures are then dried and degassed in the reactor by heating to 120° C. for about an hour. The reactors are then cooled to 70° C. and hexane solutions containing the isolated CdSe cores from above (1.95 mmol Cd content) are added to the respective reaction mixtures. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (5.5 mmol of dimethylcadmium and diethylzinc) and S (22 mmol of hexamethyldisilathiane) samples are each dissolved in 80 mL of trioctylphosphine inside a nitrogen atmosphere glove box. Once the precursor solutions are prepared, the reaction flasks are heated to 155° C. under nitrogen. The precursor solutions are added dropwise the respective reactor solutions over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitates are then dispersed in hexane and precipitated out of solution for a second time by adding a 3:1 mixture of methanol and isopropanol. The isolated core-shell nanocrystals are then dissolved in chloroform and the solutions from the three batches are mixed. (Abs/Emission/FWHM (nm)=610/632/40)

EXAMPLE 6

Preparation of Optical Component Including Two Different Types of Semiconductor Nanocrystals The following film is prepared using optical material including semiconductor nanocrystals (prepared substantially in accordance with the synthesis described in Example 5A).

6A. Optical Material Including Semiconductor Nanocrystals with a Peak Emission in the Orange Spectral Region Orange-emitting semiconductor nanocrystals prepared substantially in accordance with the synthesis described in Example 5A are dispersed in Fluorobenzene have a peak emission at 588 nm, a FWHM of about 28 nm, a solution quantum yield of 83% and a concentration of 20 mg/ml.

2.7 ml of the 20 mg/ml suspension of the orange-emitting nanocrystals is added from a 3 mL syringe to a 20 ml septum capped vial including a magnetic stirrer bar, the system is closed and purged through a syringe needle under vacuum then backfilled with nitrogen. Approximately 90 percent of the solvent is removed from the vial by vacuum stripping. 0.5 ml of RD-12, a low viscosity reactive diluent commercially available from Radcure Corp, 9 Audrey Pl, Fairfield, N.J. 07004-3401 is added. Remaining solvent is removed from the vial by vacuum stripping. 2.0 ml of DR-150 is then added to the vial through a syringe and the mixture is mixed using a Vortex mixer. (DR-150 is a UV-curable acrylic formulation commercially available from Radcure.) The mixture is then placed in an ultrasonic bath for approximately 15 minutes.

0.028 gram $TiO_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a combined formulation with long wavelength semiconductor and additional matrix material.

6B. Optical Material Including Semiconductor Nanocrystals with a Peak Emission in the Red Spectral Region Red-emitting semiconductor nanocrystals prepared substantially in accordance with the synthesis described in Example 5B are dispersed in Chloroform and have a peak emission at 632 nm, a FWHM of about 40 nm, a solution quantum yield of 70% and a concentration of 56.7 mg/ml.

99 ml of the 56.7 mg/ml suspension of the red-emitting nanocrystals is added to a septum capped Erlenmeyer flask including a magnetic stirrer bar, the system is closed and purged through a syringe needle under vacuum then backfilled with nitrogen. Approximately 95 percent of the solvent is removed from the vial by vacuum stripping. 46.6 ml of RD-12, a low viscosity reactive diluent commercially available from Radcure Corp, 9 Audrey Pl, Fairfield, N.J. 07004-3401 is added. Remaining solvent is removed from the vial by vacuum stripping, 187 ml of DR-150 is then added to the vial through a syringe and the mixture is mixed using a Vortex mixer. (DR-150 is a UV-curable acrylic formulation commercially available from Radcure.). The mixture is then placed in an ultrasonic bath for approximately 50 minutes.

Approximately 2.6 gram $TiO_2$ (Ti-Pure 902+ available from DuPont) is next added to the open vial as well as 12.9 grams of Esacure TPO previously ground to reduce particle size in a ball mill machine and the mixture is mixed with a Vortex mixer followed by mixing with an homogenizer.

The vial is then capped and deaerated under vacuum and backfilled with nitrogen.

After mixing, the closed vial is put in an ultrasonic bath for 60 minutes. Care is taken to avoid temperatures over 40° C. while the sample is in the ultrasonic bath. The sample is stored in the dark until used to make a combined formulation with long wavelength semiconductor and additional matrix material.

6C. Preparation of Host Material Including Spacer Beads 0.9 ml of RD-12, a low viscosity, reactive diluent commercially available from Radcure Corp, 9 Audrey Pl, Fairfield, N.J. 07004-3401 and 3.8 ml of DR-150, also available from Radcure Corp, is added to a 20 ml vial and the mixture is mixed using a Vortex mixer. The mixture is then placed in an ultrasonic bath for approximately 30 minutes.

Approximately 0.05 gram $TiO_2$ (Ti-Pure 902+ available from DuPont) is next added to the open vial as well as 0.05 grams of GL0179B6/45 space beads available from MO-SCI Specialty Products, Rolla, Mo. 65401 USA, and then mixed using a Vortex mixer.

After mixing, the closed vial is put in an ultrasonic bath for approximately 50 minutes. Care is taken to avoid temperatures over 40° C. while the sample is in the ultrasonic bath. The sample is stored in the dark until used to make a combined formulation with long wavelength semiconductor and additional matrix material.

6D. Preparation of Optical Material & Layer including Red and Orange Emitting Semiconductor Nanocrystals An optical material is formed by adding together in a 20 ml vial, 2.52 grams of the host material including spacer beads (prepared substantially in accordance with the procedure described in Example 6C), 0.99 grams of the optical material of Example 6B and 1.01 grams of the optical material of Example 6A. The mixture was stirred using a Vortex mixer followed by sonification in an ultrasonic bath for approximately 50 minutes.

Sample material from the combination vial is dispensed onto a Hexagon shaped flat Borosilicate glass which was previously cleaned using a caustic base bath, acid rinse, deionized water rinse, and a methanol wipe. A second Hexagon plate of the same size also previously cleaned is placed on top of the dispensed sample material and the sandwiched structure is massaged to spread the formulation evenly between the two glass plates. Excess formulation which squeezed out of the structure is wiped off of the outer portion of the glass and the Hexagon sandwich is cured in a 5000-EC UV Light Curing Flood Lamp from DYMAX Corporation system with an H-bulb (225 mW/cm$^2$) for 10 seconds. The thickness of the nanocrystal containing layer is comprises approximately 70-79 μm (approximately 360 mg of formulation).

The Hexagon sandwich consisting of two Hexagon shaped flat plates of Borosilicate glass with cured layer of acrylic containing a sample of the optical material prepared substantially as described in Example 6.

Six samples (Samples A-F) were prepared substantially as described above in Example 6. Initial CCT, CRI, and External Quantum Efficiency measurements were taken for each sample prior to heating each sample to approximately 50° C. and irradiating the sample with approximately 30 mW/cm2 of 450 nm blue light for the time specified in following Table 4 for each of the samples. CCT, CRI, and EQE measurements were taken after the irradiation time listed for the respective sample. The data is set forth in the following Table 4.

TABLE 4

Irradiation at 50° C. @ 30 mW/cm2

| Sample Label | Initial CCT (K) | Initial CRI | Initial EQE (%) | Irradiation Time, Hrs | Final CCT (K) | Final CRI | Final EQE (%) |
|---|---|---|---|---|---|---|---|
| A | 2649 | 86.5 | 62 | 1 | 2482 | 87.1 | 78 |
| B | 2664 | 85.6 | — | 13 | 2519 | 87 | 82 |
| C | 2609 | 85.6 | 65 | 2 | 2444 | 87.1 | 77 |
| D | 2641 | 85.4 | 62 | 10* | 2472 | 87.2 | 80 |
| E | 2659 | 85.2 | 63 | 11 | 2480 | 87.3 | 80 |
| F | 2684 | 84.5 | 60 | 11 | 2446 | 87.3 | 80 |

*2 hrs 50 C. @ 30 mW/cm2 450 nm, 8 hrs 50 C. @ 15 mW/cm2 450 nm

Additional information useful with the present invention, for example, relating to optical components, color conversion materials, and lighting systems, lamps, and other lighting components, is found in International Application No. PCT/US2009/02789, filed 6 May 2009, of QD Vision, Inc., et al, which is hereby incorporated herein by reference in its entirety.

In certain embodiments, a desired ligand can be attached to a semiconductor nanocrystal by building the desired functionality into the phosphonic acid derivative, amine derivative, or both. Following is a non-limiting example of a schematic of a general synthetic procedure for generating a desired phosphonic acid derivative:

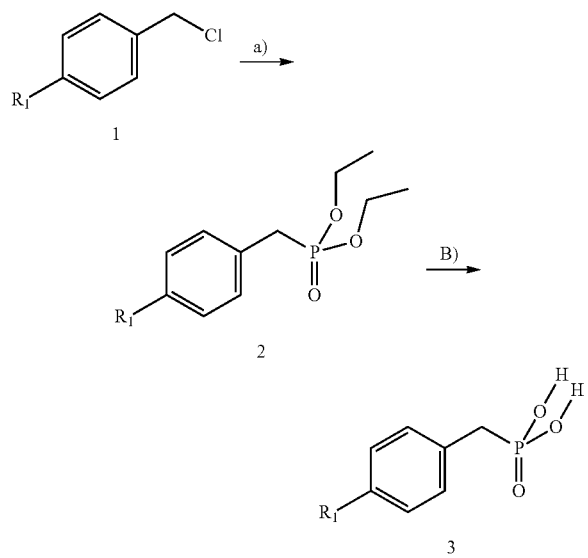

a) NaH, THF, NaI and 1.
b) 1. TMSBr, CH2Cl2. 2. H2O.

Also refer to *The Chemistry of Organophosphorus Compounds, Volume 4: Ter- and Quinque-Valent Phosphorus Acids and Their Derivatives*, Frank R. Hartley (Editor), April 1996 for more general synthetic procedures for generating phosphonic acid derivatives.

In certain additional embodiments, a desired ligand can be attached to a nanoparticle by building the desired functionality into the phosphonic acid derivative, amine derivative, or both. Following is a non-limiting example of a schematic of a general synthetic procedure for generating a desired amine derivative:

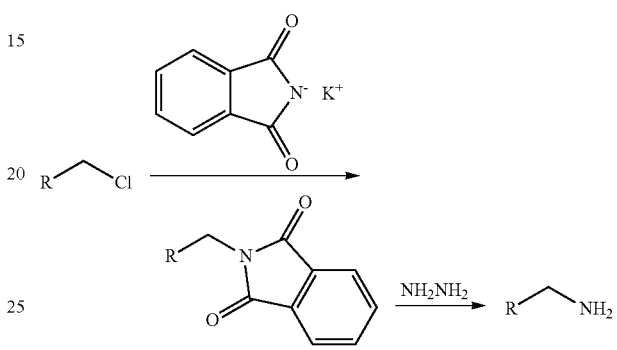

In certain embodiments, the nanoparticle described herein can be prepared by a method including reacting precursors for forming a nanoparticle having a predetermined composition in the presence of the herein described ligand X-Sp-Z, wherein X, Sp, and Z are as described herein.

In certain embodiments, the nanoparticle comprises a semiconductor nanoparticle. In certain preferred embodiments, the nanoparticle comprises a semiconductor nanocrystal. In certain embodiments, the predetermined precursors include a metal-containing precursor and a chalcogen-containing or pnictogen-containing precursor. The precursors are preferably included in the reaction mixture in amounts based on the predetermined composition.

In certain embodiments, the method is carried out in a liquid medium. Preferably, the liquid medium comprises a coordinating solvent or mixture of coordinating solvents. Examples of coordinating solvents including those provided herein. Other coordinating solvents can also be used. In certain embodiments, the method can be carried out in a liquid medium comprising a non-coordinating solvent or mixture of non-coordinating solvents. Examples of non-coordinating solvents include, but are not limited to, squalane, octadecane, or any other saturated hydrocarbon molecule. Mixtures of two or more solvents can also be used. Other suitable non-coordinating solvents can be readily ascertained by one of ordinary skill in the art.

In certain embodiments, the mole ratio of total metal included in the one or more metal-containing precursors to total moles of ligand represented by the formula X-Sp-Z is in the range from about 1:0.1 to about 1:100. In certain embodiments, the mole ratio of total moles of metal included in the one or more metal-containing precursors to total moles of ligand represented by the formula X-Sp-Z is in the range from about 1:1 to about 1:50. In certain embodiments, the mole ratio of total moles of metal included in the one or more metal-containing precursors to total moles of ligand represented by the formula X-Sp-Z is in the range from about 1:1 to about 1:30.

In certain embodiments in which the method is carried out in a liquid medium, the mole ratio of total moles of the liquid medium to total moles of ligand represented by the formula X-Sp-Z is in the range from about 500:1 to about 2:1. In certain embodiments, the mole ratio of total moles of the liquid medium to total moles of ligand represented by the formula X-Sp-Z is in the range from about 100:1 to about 5:1. In certain embodiments, the mole ratio of total moles of the liquid medium to total moles of ligand represented by the formula X-Sp-Z is in the range from about 50:1 to about 5:1.

In certain embodiments, the method can include reacting precursors for forming a nanoparticle having a predetermined composition in the presence of two or more chemically distinct ligands, at least one of said ligands being represented by the formula: X-Sp-Z, as described herein.

In certain embodiments, the method can include reacting precursors for forming a nanoparticle having a predetermined composition in the presence of two or more chemically distinct ligands, wherein a first ligand is represented by the formula: N-Sp-Z, as described herein; and a second ligand is represented by the formula: Y-Sp-Z, as described herein.

In certain embodiments, at least a portion of a surface of a nanoparticle can be coated with a coating material having a predetermined composition by a method comprising reacting precursors for the predetermined coating material in the presence of one or more of the desired ligands.

In certain preferred embodiments, the nanoparticle comprises a semiconductor nanocrystal.

In certain embodiments, the coating composition comprises a semiconductor material. In certain embodiments, the precursors include a metal-containing precursor and a chalcogen-containing or pnictogen-containing precursor. The precursors are preferably included in the reaction mixture in amounts based on the predetermined composition.

In carrying out the methods described herein, the precursors are selected and reacted in amounts and under reaction conditions, and for a period of time, to produce a nanoparticle having the predetermined composition. Such variables can be routinely determined by a person of ordinary skill in the relevant art. In certain embodiments, the reaction is carried out in a controlled atmosphere (substantially free of water moisture and air). In certain preferred embodiments, the reaction is carried out in a water-free inert atmosphere.

Quantum confined semiconductor nanoparticles (including, e.g., semiconductor nanocrystals) are nanometer-scale inorganic semiconductor nanoparticles. Semiconductor nanocrystals include, for example, inorganic crystallites between about 1 nm and about 1000 nm in diameter, preferably between about 2 nm and about 50 um, more preferably about 1 nm to about 20 nm (such as about 6, 7, 8, 9, 10, 11, 12, 13, 14, 15, 16, 17, 18, 19, or 20 nm).

Semiconductor nanocrystals included in various aspect and embodiments of the inventions most preferably have an average nanocrystal diameter less than about 150 Angstroms (Å). In certain embodiments, semiconductor nanocrystals having an average nanocrystal diameter in a range from about 12 to about 150 Angstroms can be particularly desirable.

However, depending upon the composition and desired emission wavelength of the semiconductor nanocrystal, the average diameter may be outside of these various preferred size ranges.

The semiconductor forming the nanoparticles and nanocrystals can comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

Examples of the shape of the nanoparticles and nanocrystals include sphere, rod, disk, other shape or mixtures thereof.

In certain preferred aspects and embodiments of the inventions, quantum confined semiconductor nanoparticles (including, e.g., semiconductor nanocrystals) include a "core" of one or more first semiconductor materials, which may include an overcoating or "shell" of a second semiconductor material on at least a portion of a surface of the core. In certain embodiments, the shell surrounds the core. A quantum confined semiconductor nanoparticle (including, e.g., semiconductor nanocrystal) core including a shell on at least a portion of a surface of the core is also referred to as a "core/shell" semiconductor nanocrystal.

For example, a quantum confined semiconductor nanoparticle (including, e.g., semiconductor nanocrystal) can include a core comprising a Group IV element or a compound represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as a core include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys. Examples of materials suitable for use as a shell include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

In certain embodiments, the surrounding "shell" material can have a bandgap greater than the bandgap of the core material and can be chosen so as to have an atomic spacing close to that of the "core" substrate. In another embodiment, the surrounding shell material can have a bandgap less than the bandgap of the core material. In a further embodiment, the shell and core materials can have the same crystal structure. Shell materials are discussed further below.

Quantum confined semiconductor nanoparticles are preferably members of a population of semiconductor nanoparticles having a narrow size distribution. More preferably, the quantum confined semiconductor nanoparticles (including, e.g., semiconductor nanocrystals) comprise a monodisperse or substantially monodisperse population of nanoparticles.

In certain embodiments, the % absorption of quantum confined semiconductor nanoparticles included in the various aspects and embodiments of the inventions is, for example, from about 0.1% to about 99%; and preferably of at least about 10% to about 99%. In one preferred example, the % absorption is from about 10% to about 90% absorption. In another preferred example, the % absorption is from about 10% to about 50%; in another example, the % absorption if from about 50% to about 90%.

Quantum confined semiconductor nanoparticles show strong quantum confinement effects that can be harnessed in designing bottom-up chemical approaches to create optical properties that are tunable with the size and composition of the nanoparticles.

For example, preparation and manipulation of semiconductor nanocrystals are described in Murray et al. (J. Am. Chem, Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

One example of a method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals obtained has a narrow, monodisperse distribution of diameters. The monodisperse distribution of diameters can also be referred to as a size. Preferably, a monodisperse population of particles includes a population of particles wherein at least 60% of the particles in the population fall within a specified particle size range. A population of monodisperse particles preferably deviate less than 15% rms (root-mean-square) in diameter and more preferably less than 10% rms and most preferably less than 5%.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal, e.g., M can be cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ($(TMS)_2Te$), bis(trimethylsilyl)sulfide ($(TMS)_2S$), a trialkyl phosphine sulfide such as (tri-noctylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris (trimethylsilyl) antimonide ($(TMS)_3Sb$). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

As discussed above, preferably quantum confined semiconductor nanoparticles (including, e.g., semiconductor nanocrystals) have a core/shell structure in which the core includes an overcoating on a surface of the core. The overcoating (also referred to as the shell) can be a semiconductor material having a composition that is the same as or different from the composition of the core. The overcoat of a semiconductor material on a surface of the core can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, alloys thereof, and/or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. In certain embodiments, the overcoating has a thickness of from about one to about ten monolayers.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

Additional information that may be useful with the present invention is included in International Application No. PCT/US2007/13152 of Coe-Sullivan, et al., for "Light-Emitting Devices and Displays With Improved Performance", filed 4 Jun. 2007; International Application No. PCT/US2008/007901 of Linton, et al., for "Compositions And Methods Including Depositing Nanomaterial", filed 25 Jun. 2008; International Application No. PCT/US2008/01065 of Breen, et al., for "Functionalized Semiconductor Nanoparticles And Method", filed 12 Sep. 2008; International Application No. PCT/US2007/024750 of Coe-Sullivan, et al. for "Improved Composites And Devices Including Nanoparticles", filed 3 Dec. 2007; and U.S. Ser. No. 12/283,609 of Coe-Sullivan, et al. for "Compositions, Optical Component, System Including An Optical Component, Devices, And Other Products", filed 12 Sep. 2008. The disclosures of each of the foregoing applications are hereby incorporated herein by reference in their entireties.

In various aspects and embodiments of the inventions contemplated by this disclosure, quantum confined semiconductor nanoparticles (including, but not limited to, semiconductor nanocrystals) optionally have other ligands attached thereto in addition to the ligands described herein.

In certain embodiments, such additional ligands can be derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. In other embodiments, semiconductor nanocrystals can alternatively be prepared with use of non-coordinating solvent(s).

A suitable coordinating ligand can be purchased commercially or prepared by ordinary synthetic organic techniques, for example, as described in J. March, Advanced Organic Chemistry, which is incorporated herein by reference in its entirety. Other suitable additional known ligands can be used.

When an electron and hole localize on a quantum confined semiconductor nanoparticle (including, but not limited to, a semiconductor nanocrystal), emission can occur at an emission wavelength. The emission has a frequency that corresponds to the band gap of the quantum confined semiconductor material. The band gap is a function of the size of the nanoparticle. Quantum confined semiconductor nanoparticle s having small diameters can have properties intermediate between molecular and bulk forms of matter. For example, quantum confined semiconductor nanoparticles having small diameters can exhibit quantum confinement of both the electron and hole in all three dimensions, which leads to an increase in the effective band gap of the material with decreasing crystallite size. Consequently, for example, both the optical absorption and emission of semiconductor nanocrystals shift to the blue, or to higher energies, as the size of the crystallites decreases.

The emission from a quantum confined semiconductor nanoparticle can be a narrow Gaussian emission band that can be tuned through the complete wavelength range of the ultraviolet, visible, or infra-red regions of the spectrum by varying the size of the quantum confined semiconductor nanoparticle, the composition of the quantum confined semiconductor nanoparticle, or both. For example, CdSe can be tuned in the visible region and InAs can be tuned in the infra-red region. The narrow size distribution of a population of quantum confined semiconductor nanoparticles can result in emission of light in a narrow spectral range. The population can be monodisperse preferably exhibits less than a 15% rms (root-mean-square) deviation in diameter of the quantum confined semiconductor nanoparticle s, more preferably less than 10%, most preferably less than 5%. Spectral emissions in a narrow range of no greater than about 75 nm, preferably 60 nm, more preferably 40 nm, and most preferably 30 nm full width at half max (FWHM) for quantum confined semiconductor nanoparticle s that emit in the visible can be observed. IR-emitting quantum confined semiconductor nanoparticle s can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of quantum confined semiconductor nanoparticle diameters decreases.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum confined semiconductor nanoparticles are preferably handled in a controlled (oxygen-free and moisture-free) environment, preventing the quenching of luminescent efficiency during the fabrication process.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. An optical element comprising a plurality of quantum confined semiconductor nanoparticles and a carrier substrate, wherein a predetermined arrangement of the quantum confined semiconductor nanoparticles is included in the carrier substrate or wherein a predetermined arrangement of the quantum confined semiconductor nanoparticles is included in a layer disposed over a predetermined portion of a surface of the carrier substrate, and wherein at least a portion of the nanoparticles include a native ligand attached to a surface thereof, the ligand being represented by the formula:

wherein:
X represents a primary amine group, a secondary amine group, a urea group, a thiourea group, an amide group, a phosphonic acid group, or a phosphinic acid group;
Sp represents a spacer group, such as a group capable of allowing a transfer of charge or an insulating group; and
Z represents: (i) a reactive group capable of communicating specific chemical properties to the nanocrystal as well as provide specific chemical reactivity to the surface of the nanocrystal, and/or (ii) a group that is cyclic, halogenated, or a polar a-protic, wherein the nanoparticles are included in a composition further including a host material and scatterers.

2. The optical element in accordance with claim 1, wherein the carrier substrate comprises a substantially optically transparent material.

3. The optical element in accordance with claim 1, wherein the optical element includes from about 0.001 to about 15 weight percent quantum confined semiconductor nanoparticles based on the weight of the optical element.

4. The optical element in accordance with claim 1, wherein the nanoparticles are included in the composition in an amount in the range from about 0.001 to about 15 weight percent based on the weight of the host material.

5. The optical element in accordance with claim 1, wherein the optical element comprises a decal.

6. The optical element in accordance with claim 1, wherein the layer including the quantum confined semiconductor nanoparticles is adapted to be fixedly attached to the surface of the carrier substrate.

7. The optical element in accordance with claim 1, wherein the layer including the quantum confined semiconductor nanoparticles is adapted to be removably attached to the surface of the carrier substrate.

8. An optical component comprising the optical element in accordance with claim 1, wherein the layer including the quantum confined semiconductor nanoparticles is attached to a surface of a waveguide component.

9. The optical element in accordance with claim 1, wherein the scatterers are included in the composition in an amount in the range from about 0.001 to about 15 weight percent of the weight of the host material.

10. The optical element film in accordance with claim 1, wherein Z represents OR or SR, wherein R independently represents hydrogen, an alkyl group, or an aryl group.

11. The optical element film in accordance with claim 1, wherein the ligand represented by the formula X-Sp-Z comprises benzylphosphonic acid.

12. The optical element film in accordance with claim 1, wherein the ligand represented by the formula X-Sp-Z comprises 3,5-di-tert-butyl-4-hydroxybenzylphosphonic acid, a conjugate base of the acid, or a mixture including one or more of the foregoing.

13. An ink composition comprising quantum confined semiconductor nanoparticles, scatterers, and a liquid vehicle, wherein the liquid vehicle comprises a composition including one or more functional groups that are capable of being cross-linked, wherein at least a portion of the nanoparticles include a native ligand attached to a surface thereof, the ligand being represented by the formula:

X-Sp-Z wherein:
X represents a primary amine group, a secondary amine group, a urea group, a thiourea group, an amide group, a phosphonic acid group, or a phosphinic acid group;
Sp represents a spacer group, such as a group capable of allowing a transfer of charge or an insulating group; and
Z represents: (i) a reactive group capable of communicating specific chemical properties to the nanocrystal as well as provide specific chemical reactivity to the surface of the nanocrystal, and/or (ii) a group that is cyclic, halogenated, or a polar a-protic.

14. An ink composition comprising quantum confined semiconductor nanoparticles, a liquid vehicle, and scatterers, wherein at least a portion of the nanoparticles include a native ligand attached to a surface thereof, the ligand being represented by the formula:

X-Sp-Z wherein:
X represents a primary amine group, a secondary amine group, a urea group, a thiourea group, an amide group, a phosphonic acid group, or a phosphinic acid group;
Sp represents a spacer group, such as a group capable of allowing a transfer of charge or an insulating group; and
Z represents: (i) a reactive group capable of communicating specific chemical properties to the nanocrystal as well as provide specific chemical reactivity to the surface of the nanocrystal, and/or (ii) a group that is cyclic, halogenated, or a polar a-protic.

* * * * *